United States Patent
Oh et al.

(10) Patent No.: US 7,265,031 B2
(45) Date of Patent: Sep. 4, 2007

(54) METHODS OF FABRICATING SEMICONDUCTOR-ON-INSULATOR (SOI) SUBSTRATES AND SEMICONDUCTOR DEVICES USING SACRIFICIAL LAYERS AND VOID SPACES

(75) Inventors: Chang-Woo Oh, Gyeonggi-do (KR);
Dong-Gun Park, Gyeonggi-do (KR);
Sung-Young Lee, Gyeonggi-do (KR);
Jeong-Dong Choe, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 227 days.

(21) Appl. No.: 10/972,972

(22) Filed: Oct. 25, 2004

(65) Prior Publication Data

US 2005/0118783 A1    Jun. 2, 2005

(30) Foreign Application Priority Data

Nov. 27, 2003    (KR) .................. 10-2003-0085237

(51) Int. Cl.
*H01L 21/84*    (2006.01)
(52) U.S. Cl. .................................... 438/459
(58) Field of Classification Search ........ 438/455–459; 257/E21.561
See application file for complete search history.

(56) References Cited

U.S. PATENT DOCUMENTS

| | | | |
|---|---|---|---|
| 5,057,450 A | 10/1991 | Bronner et al. | |
| 5,963,817 A | 10/1999 | Chu et al. | |
| 6,670,212 B2 * | 12/2003 | McNie et al. | 438/52 |
| 6,946,314 B2 * | 9/2005 | Sawyer et al. | 438/50 |
| 7,052,948 B2 * | 5/2006 | Murphy et al. | 438/219 |

FOREIGN PATENT DOCUMENTS

| | | |
|---|---|---|
| KR | 2002-0052458 A | 7/2002 |
| KR | 10-0353468 B1 | 9/2002 |

OTHER PUBLICATIONS

Korean Office Action, KR 10-2003-0085237, Aug. 31, 2005.

* cited by examiner

*Primary Examiner*—Richard A. Booth
(74) *Attorney, Agent, or Firm*—Myers Bigel Sibley & Sajovec, P.A.

(57) ABSTRACT

An SOI substrate is fabricated by providing a substrate having a sacrificial layer thereon, an active semiconductor layer on the sacrificial layer remote from the substrate and a supporting layer that extends along at least two sides of the active semiconductor layer and the sacrificial layer and onto the substrate, and that exposes at least one side of the sacrificial layer. At least some of the sacrificial layer is etched through the at least one side thereof that is exposed by the supporting layer to form a void space between the substrate and the active semiconductor layer, such that the active semiconductor layer is supported in spaced-apart relation from the substrate by the supporting layer. The void space may be at least partially filled with an insulator lining.

41 Claims, 40 Drawing Sheets

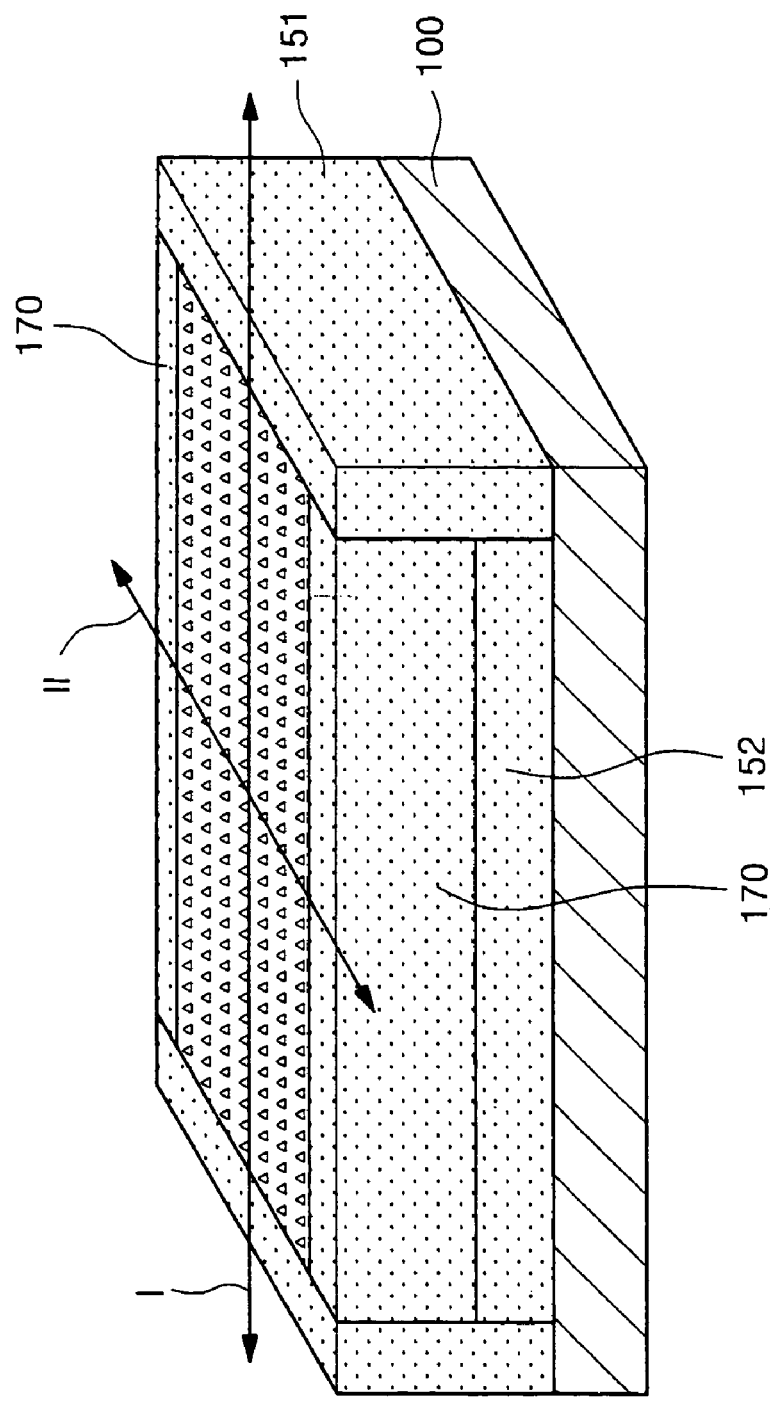

METHODS OF FABRICATING SEMICONDUCTOR-ON-INSULATOR (SOI) SUBSTRATES AND SEMICONDUCTOR DEVICES USING SACRIFICIAL LAYERS AND VOID SPACES

CROSS-REFERENCE TO RELATED APPLICATION

This application claims the benefit of priority Korea Patent Application No. 2003-85237 filed on Nov. 27, 2003, the disclosure of which is hereby incorporated herein by reference in its entirety as if set forth fully herein.

FIELD OF THE INVENTION

The present invention relates to fabricating semiconductor devices and, more particularly, to methods for forming Semiconductor-on-Insulator (SOI) substrates and devices, and semiconductor devices fabricated thereby.

BACKGROUND OF THE INVENTION

As the integration density of integrated circuit semiconductor devices continues to increase, it may be increasingly difficult to isolate microelectronic devices such as transistors, from one another, when they are formed in bulk semiconductor substrates such as bulk silicon semiconductor substrates. Semiconductor-on-Insulator (SOI) technology has been proposed as an alternative to bulk semiconductor technology. In SOI technology a thin semiconductor layer is formed on a substrate, which may be a semiconductor substrate, with an intervening insulator layer therebetween. Microelectronic devices such as transistors are formed in the thin semiconductor layer, which may be referred to as an active semiconductor layer or an active layer. Often the active semiconductor layer comprises a thin monocrystalline silicon layer, the insulating layer comprises a silicon oxide layer, and the substrate is a monocrystalline silicon substrate. However, other substrates, insulating layers and active semiconductor layers may be used.

Hereinafter, conventional methods for fabricating an SOI substrate will be described with reference to FIGS. 1A to 1F.

Referring to FIGS. 1A and 1B, a base wafer W1 and a bonding wafer W2 are prepared. The base wafer W1 includes a silicon substrate 10 and an oxidation layer 11 formed on the silicon substrate 10. The bonding wafer W2 includes a silicon substrate 20, and an isolation layer 21 and a silicon layer 22 stacked on the silicon substrate 20 in sequence. The isolation layer 21 may be formed of various materials. For example, the isolation layer 21 may be formed of a porous silicon layer or an ion-implanted silicon layer.

Referring to FIG. 1C, thermal treatment is performed while the oxidation layer 11 of the base wafer W1 and the silicon layer 22 of the bonding wafer W2 are contacted to each other to thereby bond the base wafer W1 and the bonding wafer W2.

Referring to FIG. 1D, the silicon substrate 20 of the bonding wafer W2 is isolated from the base wafer W1 by removing the isolation layer 21, and the surface of the silicon layer 22 is polished.

In accordance with the above-mentioned procedure, an SOI substrate including the silicon substrate 10, the oxidation layer 11, and the silicon layer 22, is prepared. The silicon layer 22 acts as an active semiconductor layer where active elements such as MOS transistors are formed. Thus, the thickness of the silicon layer 22 affects the performance of the MOS transistors. For example, the thickness of the silicon layer 22 may be reduced in order to potentially improve short channel effects of the MOS transistors.

Referring to FIG. 1E, the silicon layer 22 is thermally oxidized to thereby form a thermal oxidation layer 13 on the surface of the silicon layer 22. As a result, the thickness of the silicon layer 22 is reduced so that a silicon layer 22a thinner than the silicon layer 22 can be obtained.

Referring to FIG. 1F, the thermal oxidation layer 13 is removed to expose the silicon layer 22a. The final thickness of the silicon layer 22a may be determined by the thermal oxidation processing time or the number of the repeating thermal oxidation process.

The above-mentioned conventional method for fabricating the SOI substrate adjusts the thickness of the silicon layer 22 by forming and removing the thermal oxidation layer on the surface of the silicon layer 22, so that the thickness may be difficult to control, and in addition, the silicon layer may be largely consumed. Thus, the method may not be desirable for mass production because the manufacturing cost may increase.

Moreover, in the conventional method for fabricating the SOI substrate, in order to perform processes of reducing the isolation layer 21 and polishing the silicon layer 22, the silicon layer 22 should be formed to have at least a minimum thickness. However, a wafer having a large diameter may have a large temperature difference according to the area of its surface, a high degree of bending, and/or a uniformity difference when polishing, oxidation and/or etching processes are performed, compared to a wafer having a small diameter. In particular, the thinner the silicon layer, the greater the uniformity variation may become, so that the thickness difference over the wafer may be excessive. The thickness difference over the area of the wafer may still be present after the polishing and oxidation processes of the silicon layer 22, so that it may become more difficult to obtain the thin and uniform silicon layer 22a.

SUMMARY OF THE INVENTION

Some embodiments of the present invention fabricate an SOI substrate by providing a substrate having a sacrificial layer thereon, an active semiconductor layer on the sacrificial layer remote from the substrate and a supporting layer that extends along at least two sides of the active semiconductor layer and the sacrificial layer and onto the substrate, and that exposes at least one side of the sacrificial layer. At least some of the sacrificial layer is etched through the at least one side thereof that is exposed by the supporting layer to form a void space between the substrate and the active semiconductor layer, such that the active semiconductor layer is supported in spaced-apart relation from the substrate by the supporting layer. In some embodiments, the void space may be at least partially filled with an insulator lining.

Other embodiments of the present invention fabricate an SOI substrate by forming a stack pattern including a sacrificial layer and an active semiconductor layer, which can be epitaxially grown on a substrate such as a semiconductor substrate, in sequence. The sacrificial layer is formed of a material having etch selectivity with respect to the substrate and the active semiconductor layer. A supporting pattern is formed on the semiconductor substrate to contact at least two sides of the stack pattern. At least one side of the active layer and the sacrificial layer of the stack pattern are exposed. The sacrificial layer is then selectively removed through the at least one side thereof that is exposed to form a void space between the substrate and the active semiconductor layer.

Methods for fabricating an SOI substrate in accordance with other embodiments of the present invention comprise forming a supporting pattern on a substrate. A sacrificial layer and an active semiconductor layer are formed, which may be epitaxially grown on the exposed portion of the substrate such that at least two sides thereof are in contact with the supporting pattern and at least one side of the sacrificial layer and the active semiconductor layer are exposed. The sacrificial layer is formed of a material having etch selectivity with respect to the substrate and the active semiconductor layer. The sacrificial layer and the active semiconductor layer that are not in contact with the supporting pattern are selectively removed to expose other sides of the sacrificial layer and the active semiconductor layer. The sacrificial layer is selectively removed to form a void space between the substrate and the active semiconductor layer.

Other embodiments of the present invention provide methods for fabricating semiconductor devices using an SOI substrate. These embodiments comprise epitaxially growing a sacrificial layer and an active semiconductor layer on a substrate in sequence. The sacrificial layer is formed of a material having etch selectivity with respect to the substrate and the active semiconductor layer. The active semiconductor layer and the sacrificial layer are patterned to expose portions of the substrate in a device isolation region. A first device isolation layer is formed on the exposed substrate to contact at least two sides of the patterned sacrificial layer and active semiconductor layer. At least one of the sides of the sacrificial layer and the active semiconductor layer that are not covered with the first device isolation layer are exposed. The sacrificial layer is selectively removed to form a void space between the substrate and the active semiconductor layer. In this case, the first device isolation layer is used as a supporting layer of the active layer. A second device isolation layer is then formed to cover the exposed sides of the void space and the active semiconductor layer. A gate electrode is then formed on the active layer.

Methods for fabricating a semiconductor device using an SOI substrate in accordance with embodiments of the present invention comprise forming an insulating layer or a device isolation region on a substrate that exposes a portion of the substrate. A sacrificial layer and an active semiconductor layer, of which at least two sides are in contact with the insulating layer, are formed on the exposed substrate in sequence after the insulating layer is formed. The sacrificial layer is formed of a material having etch selectivity with respect to the substrate and the active semiconductor layer. The insulating layer is patterned to form a first device isolation layer, which covers at least two sides of the sacrificial layer and the active semiconductor layer and that exposes at least one side of the sacrificial layer and the active semiconductor layer. The sacrificial layer is selectively removed to form a void space between the semiconductor substrate and the active layer, and the first device isolation layer is used as a supporting layer of the active layer. A second device isolation layer is then formed to cover the at least one exposed side of the active semiconductor layer and void space. A gate electrode is then formed on the active layer.

Methods for fabricating semiconductor devices in accordance with other embodiments of the present invention form a first device isolation layer that covers portions of a device isolation region on a substrate. A sacrificial layer and an active semiconductor layer, the sides of which are in contact with the first device isolation layer, are epitaxially grown on the exposed semiconductor substrate in sequence after the first device isolation layer is formed. The sacrificial layer is formed of a material having etch selectivity with respect to the semiconductor substrate and the active semiconductor layer. The active semiconductor layer and the sacrificial layer that are not in contact with the first device isolation layer are selectively etched to expose at least one other side of the sacrificial layer and the active layer. The sacrificial layer is selectively removed to form a void space between the substrate and the active semiconductor layer. In this case, the first device isolation layer is used as a supporting layer of the active layer. A second device isolation layer is then formed to cover the exposed sides of the active semiconductor layer and the void space. A gate electrode is then formed on the active layer.

Embodiments of the present invention also can provide a semiconductor device formed on an SOI substrate. The semiconductor device comprises a semiconductor substrate, a device isolation layer on the semiconductor substrate, and an active semiconductor layer supported by the device isolation layer and spaced from the semiconductor substrate by a void space therebetween. The active layer may have a lattice constant close to that of the semiconductor substrate.

The semiconductor device may further comprise a gate electrode formed on the active layer. The gate electrode may cover sides of the active layer. In addition, the gate electrode may cover the upper surface of the active layer.

BRIEF DESCRIPTION OF THE DRAWINGS

FIGS. 2A to 2F show perspective views for explaining methods for fabricating SOI substrates in accordance with embodiments of the present invention.

DETAILED DESCRIPTION OF THE INVENTION

Figure 1A:
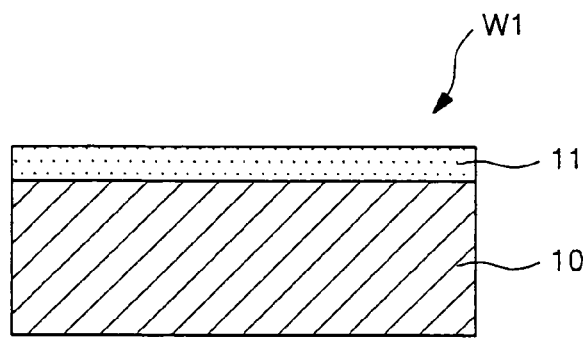
FIGS. 1A to 1F show cross-sectional views for explaining a method for fabricating an SOI substrate in accordance with the prior art.
Figure 1B:
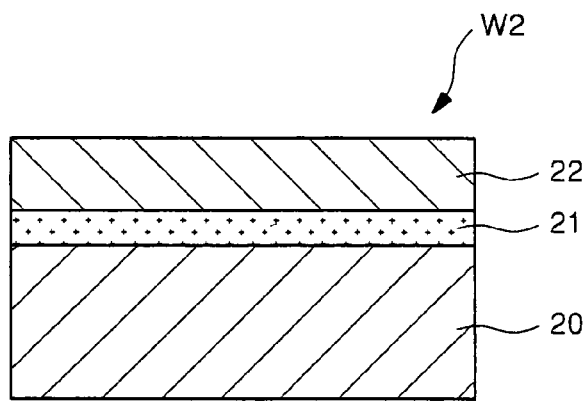
Figure 1C:
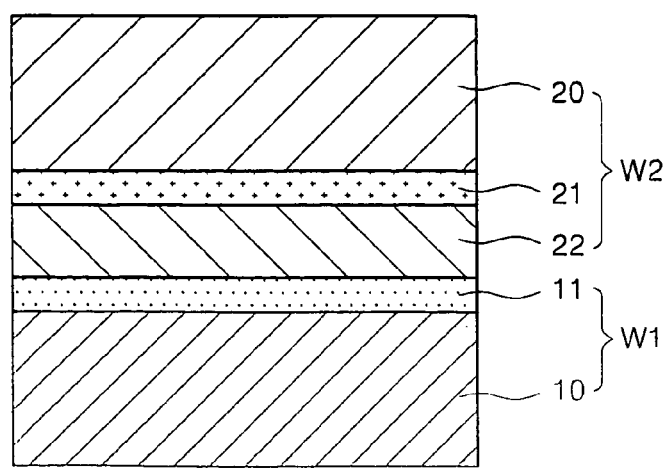
Figure 1D:
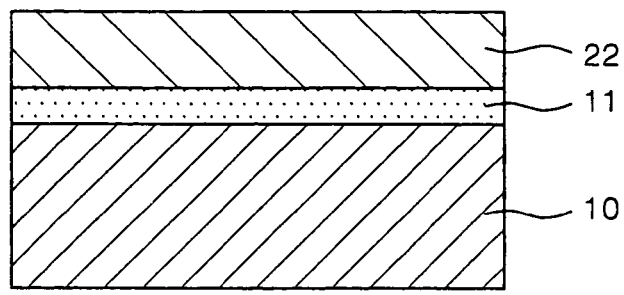
Figure 1E:
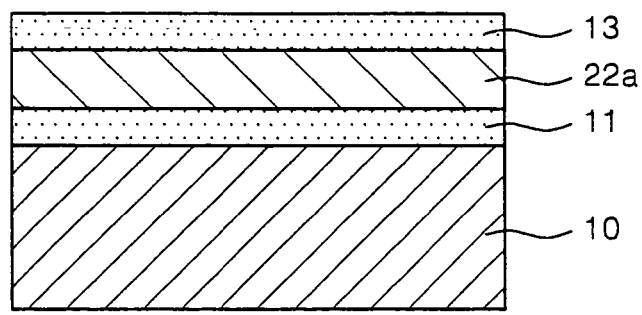
Figure 1F:
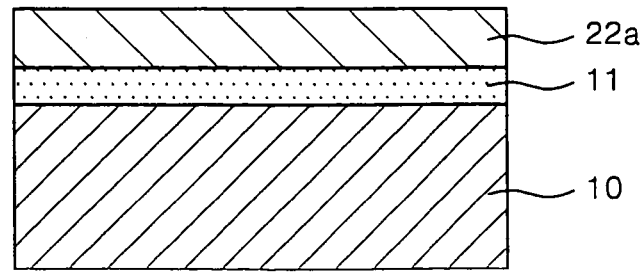

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on" another element or layer, it can be directly on the other element or layer or intervening elements or layers may be present. In contrast, when an element is referred to as being "directly on" another element or layer, there are no intervening elements or layers present. Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-sectional and/or other views that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a grown or deposited region illustrated as a polygon will, typically, have rounded or curved features and/or a gradient of concentrations at its edges with another region rather than a discrete change from a first region to a second region of different composition. Thus, the regions illustrated in the figures are schematic in nature and their shapes are not intended to illustrate the precise shape of a region of a device and are not intended to limit the scope of the present invention.

FIGS. 2A to 2F show perspective views for explaining methods for fabricating an SOI substrate in accordance with embodiments of the present invention. In addition, FIGS. 3A to 3F show vertical cross-sectional views taken along line I of FIGS. 2A to 2F, and FIGS. 4A to 4F show vertical cross-sectional views taken along line II of FIGS. 2A to 2F.

Figure 2A:
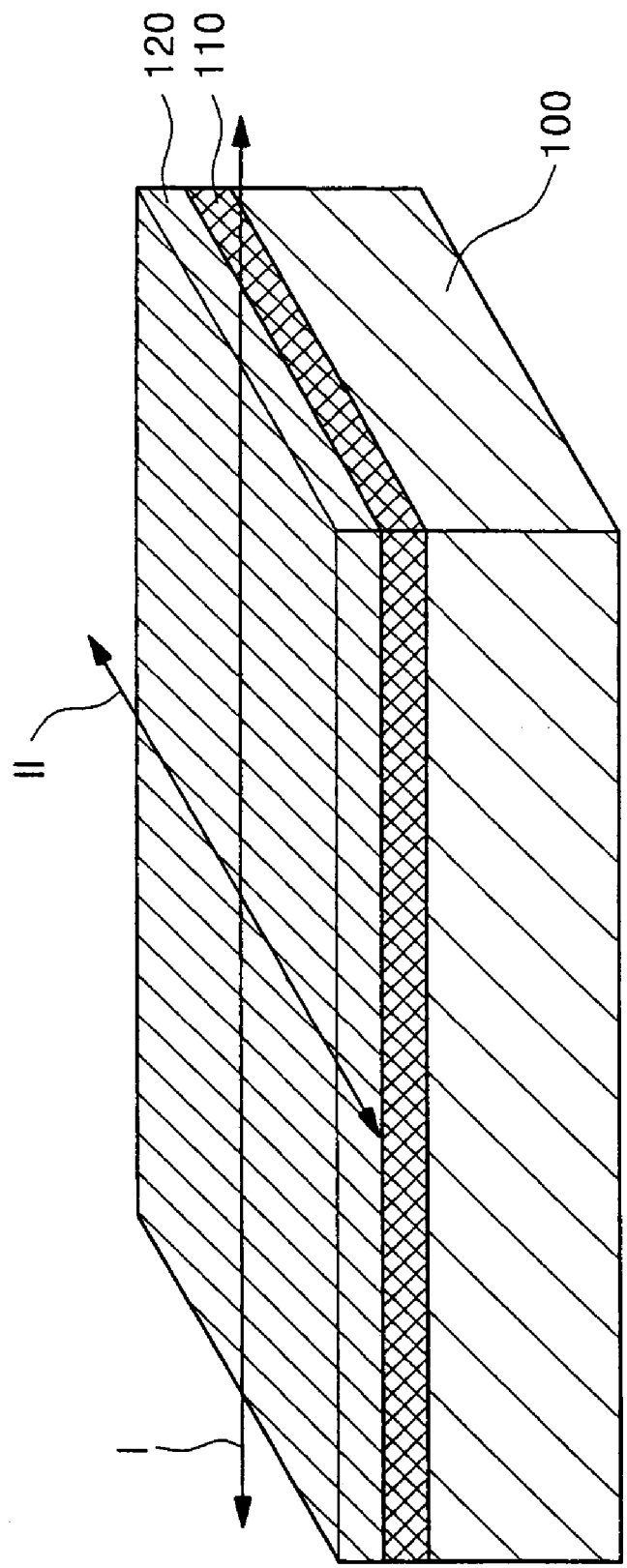
Figure 3A:
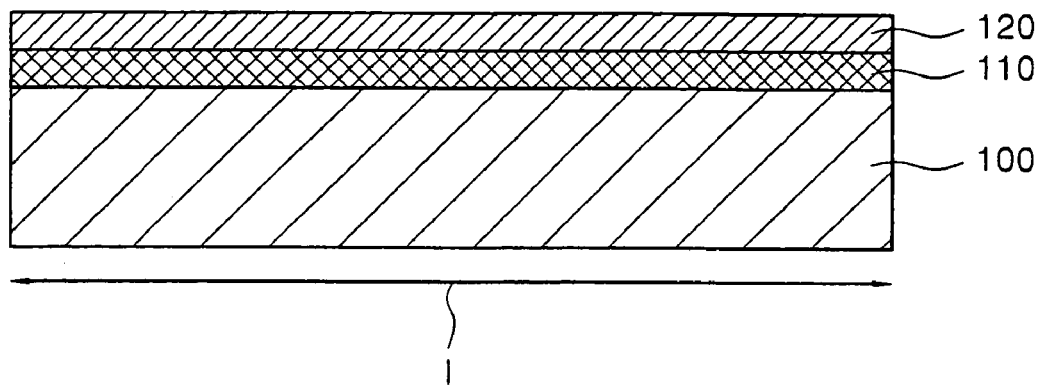
FIGS. 3A to 3F show vertical cross-sectional views taken along line I of FIGS. 2A to 2F.
Figure 4A:
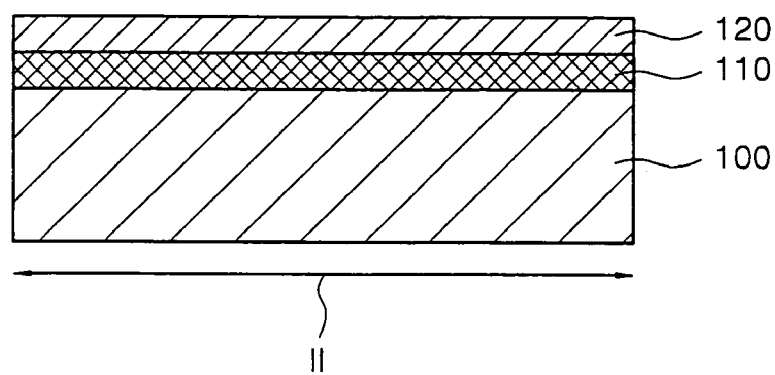
FIGS. 4A to 4F show vertical cross-sectional views taken along line II of FIGS. 2A to 2F.

Referring to FIGS. 2A, 3A, and 4A, a sacrificial layer 110 and an active semiconductor layer, also referred to herein simply as an active layer, 120, are sequentially formed on a substrate 100, which may be a semiconductor substrate such as a monocrystalline Si substrate. In some embodiments the sacrificial layer 110 and the active layer 120 are formed by an epitaxial growth method capable of adjusting their thickness. In some embodiments, the sacrificial layer 110 is formed of a material layer having etch selectivity with respect to the active layer 120 and having a lattice constant close to that of the active layer 120. For example, when the active layer 120 comprises an epitaxial Si layer, the sacrificial layer 110 may comprise an epitaxial SiGe layer.

The sacrificial layer 110 and the active layer 120 may be formed by various epitaxial growth methods. For example, a chemical vapor deposition (CVD) method or a Molecular Beam Epitaxy method may be employed. A furnace type device may be used as a deposition device for forming the sacrificial layer 110.

Silicon source gas such as $SiH_4$, $SiH_2Cl_2$, $SiCl_4$ and/or $Si_2H_6$ and/or germanium source gas such as $GeH_4$ may be used for growing the sacrificial layer 110. The source gas such as $SiH_4$, $SiH_2Cl_2$, $SiCl_4$ and/or $Si_2H_6$ may be used for growing the active layer 120.

Figure 2B:
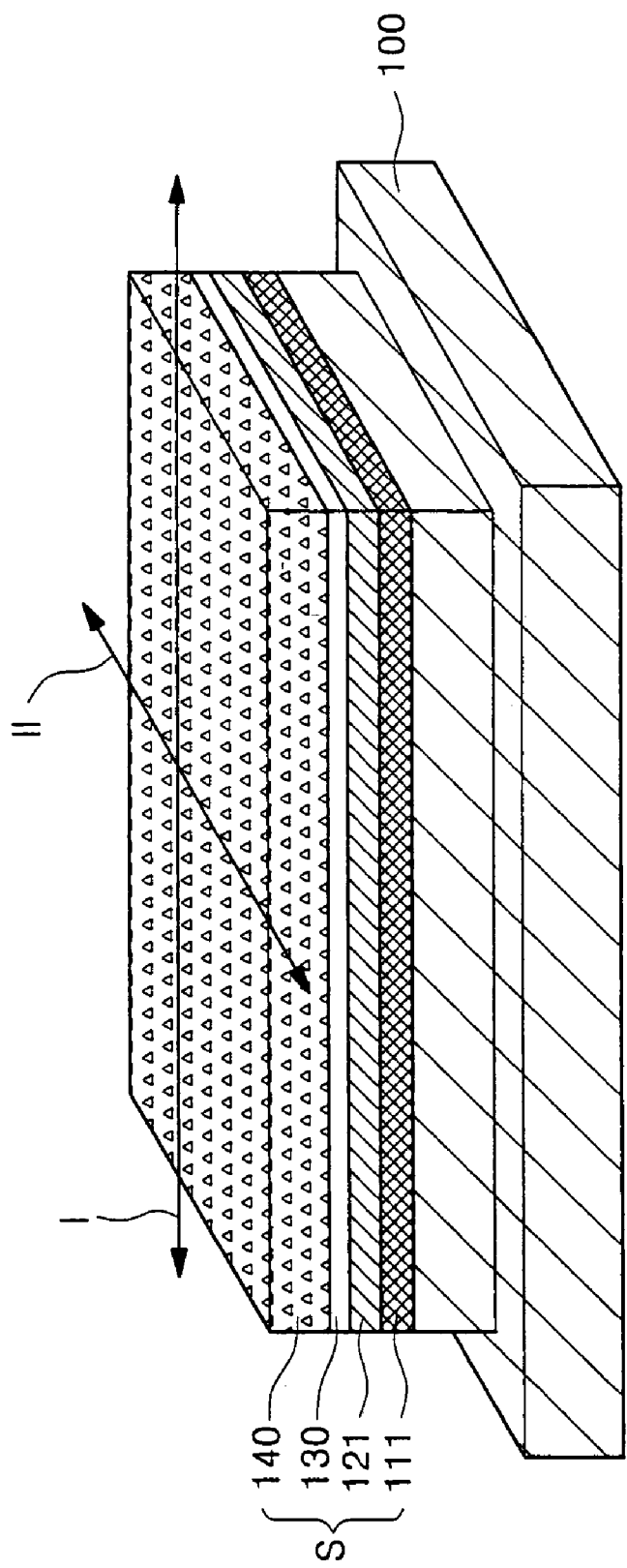
Figure 3B:
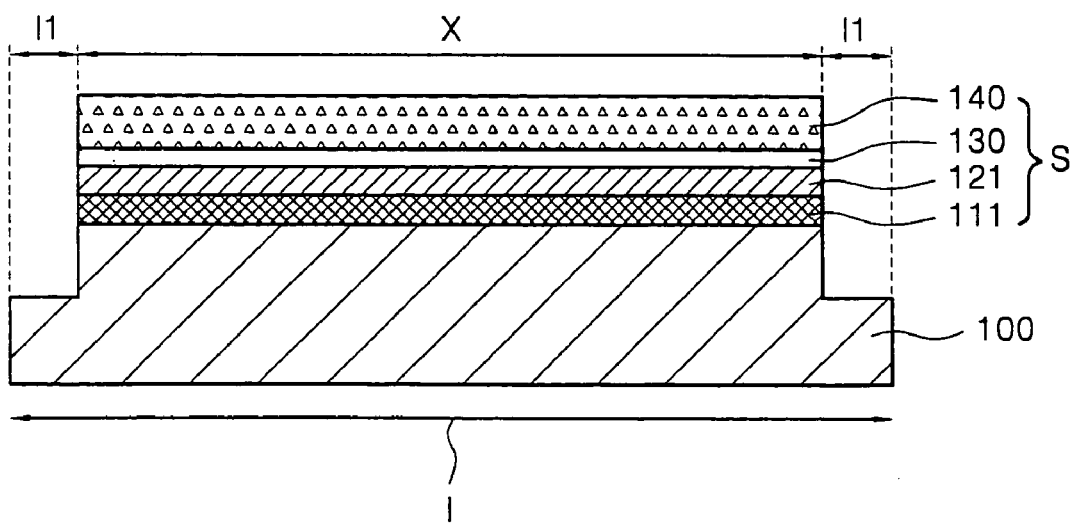
Figure 4B:
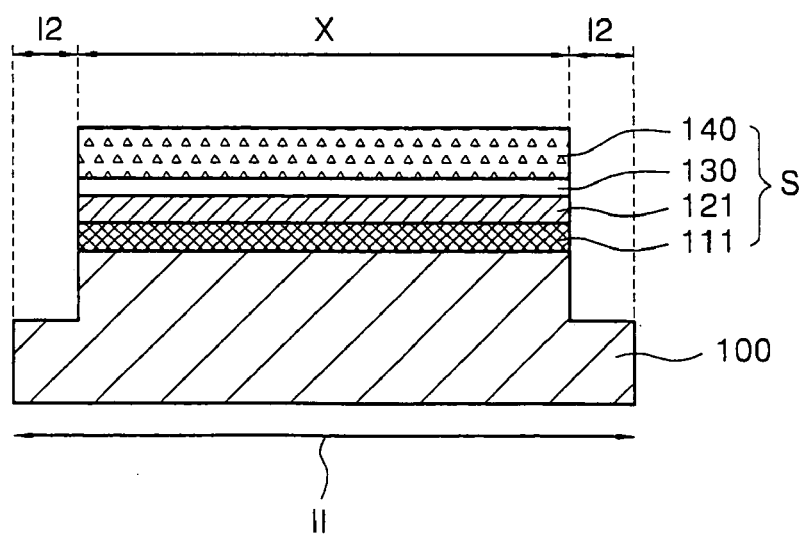

Referring to FIGS. 2B, 3B, and 4B, a silicon nitride layer 140 and a pad oxidation layer 130 are formed on the active layer 121 to cover an active region X. The active layer 120 and the sacrificial layer 110 are then patterned to form a patterned active layer 121 and a patterned sacrificial layer 111. A stack pattern S is formed on the substrate 100, wherein the stack pattern S comprises the silicon nitride layer 140, the pad oxidation layer 130, the active layer 121 and the sacrificial layer 111. As the stack pattern S is formed, the substrate 100 of device isolation regions I1 and I2 surrounding the active region X is exposed. Moreover, after forming the active layer 121 and the sacrificial layer 111, some portions of the substrate 100 may be etched.

Figure 2C:
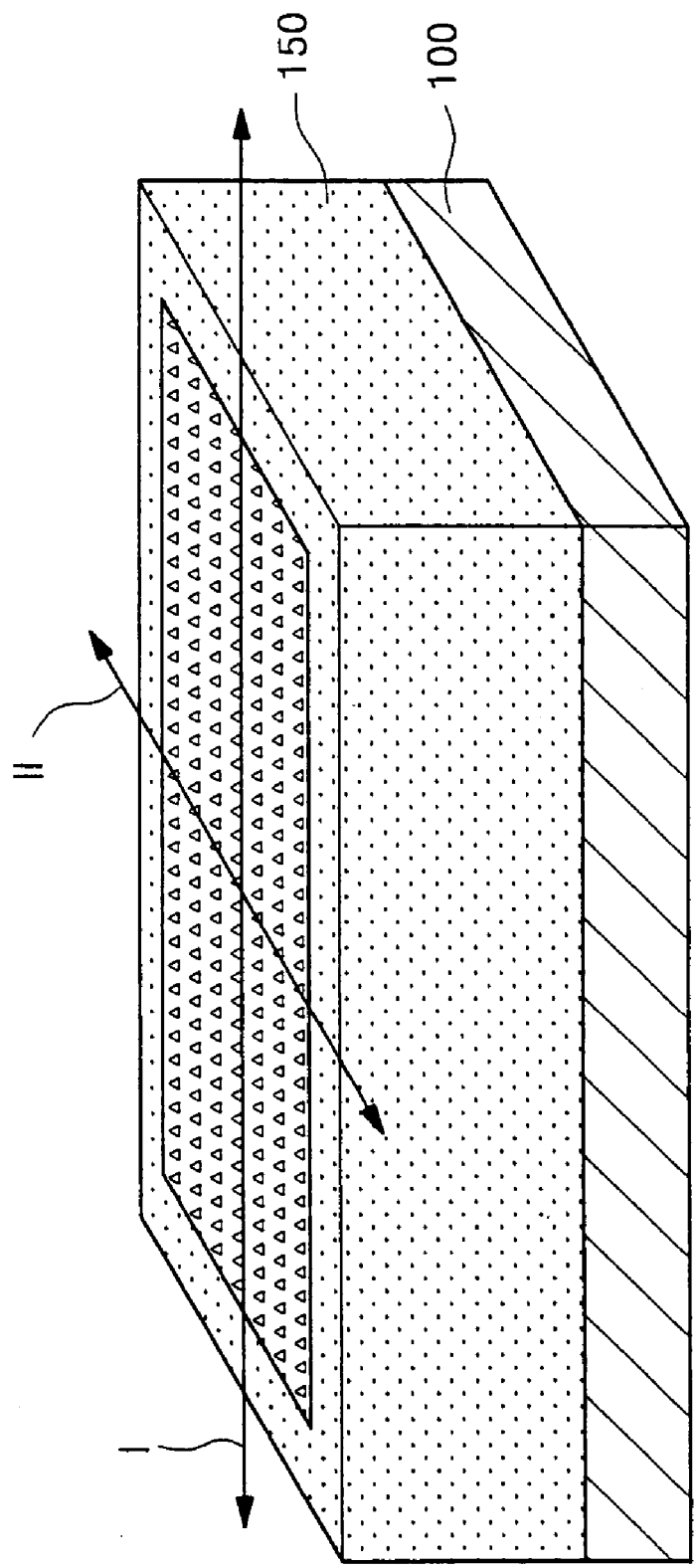
Figure 3C:
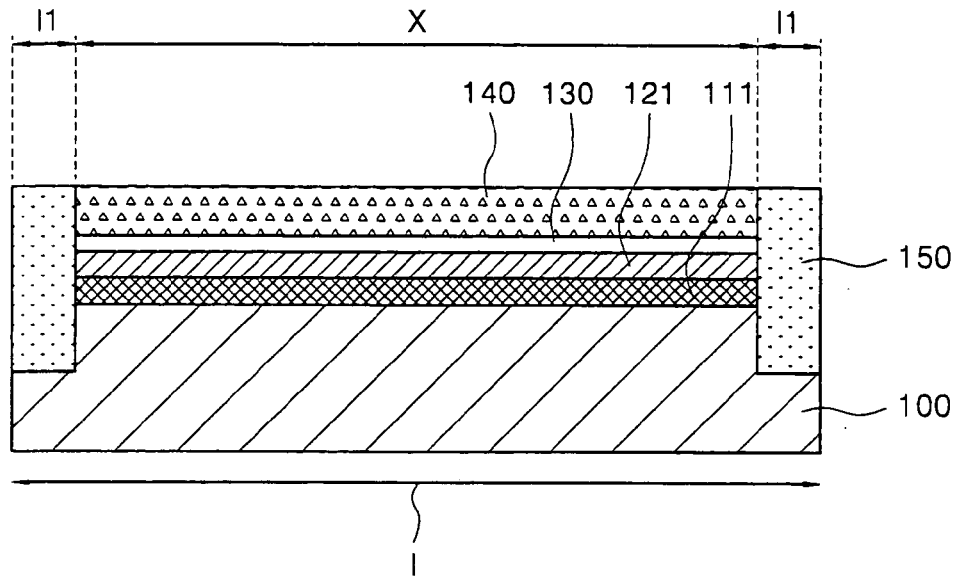
Figure 4C:
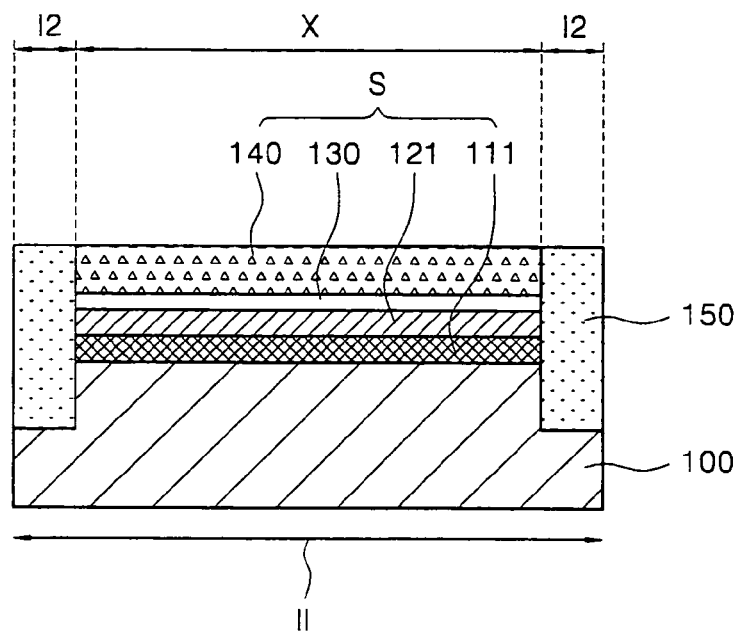

Referring to FIGS. 2C, 3C, and 4C, an insulating layer 150 is formed to act as a supporting layer on the substrate 100 of the device isolation regions I1 and I2. The insulating layer 150 surrounds sides of the active layer 121 and the sacrificial layer 111. The insulating layer 150 may be a single layer or a stacked layer comprising two or more kinds of insulating layers. The stacked layer may include an oxidation layer and a nitride layer. Furthermore, when the insulating layer 150 is formed of the oxidation layer, a chemical mechanical polishing or etchback process may be performed after performing thermal oxidation and oxidation layer deposition processes in sequence.

Moreover, when some portions of the substrate 100 are etched after forming the active layer 121 and the sacrificial layer 111 in accordance with the above-mentioned process, the portions of the semiconductor substrate 100 may also be in contact with the insulating layer 150.

Figure 2D:
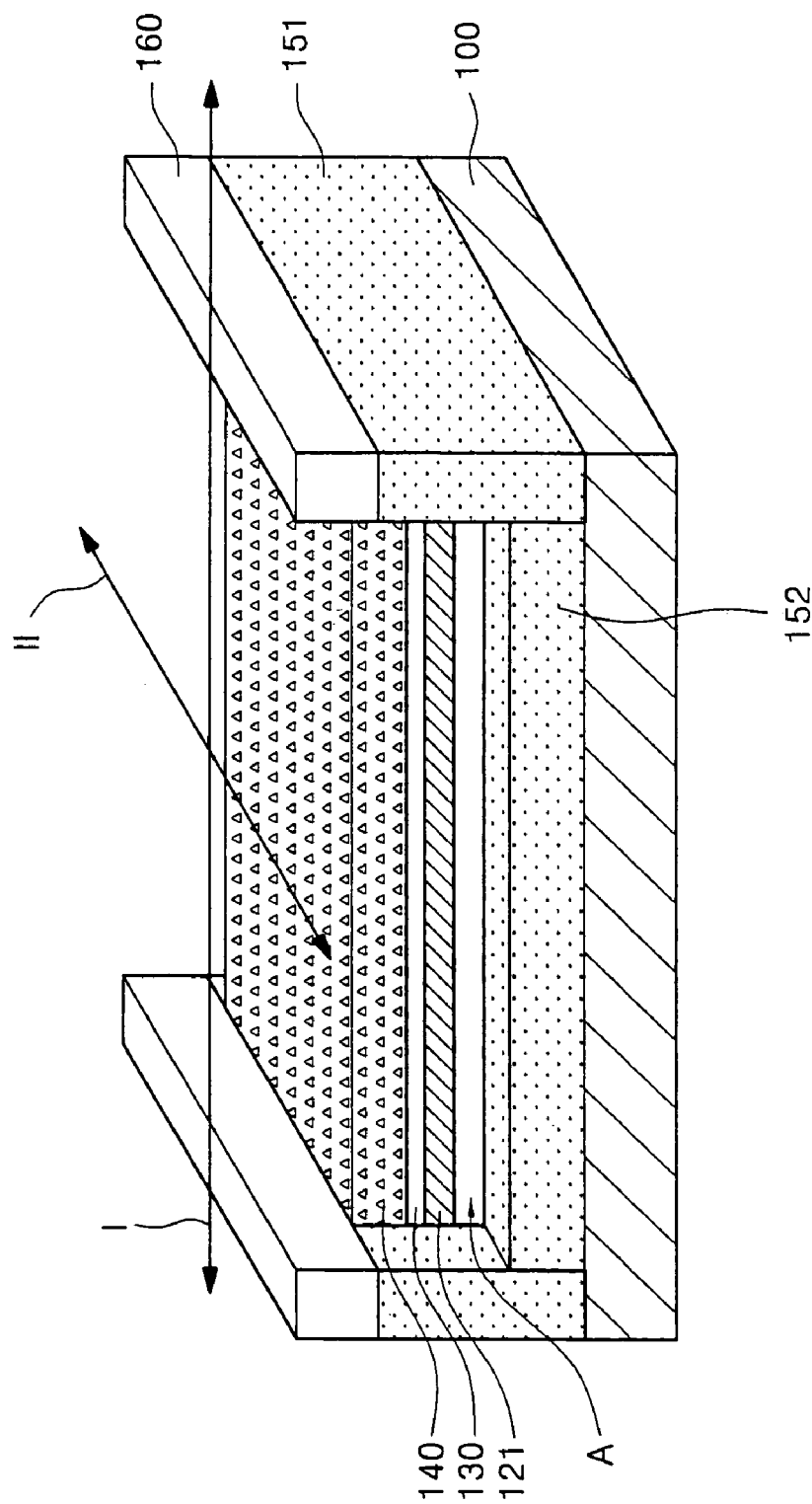
Figure 3D:
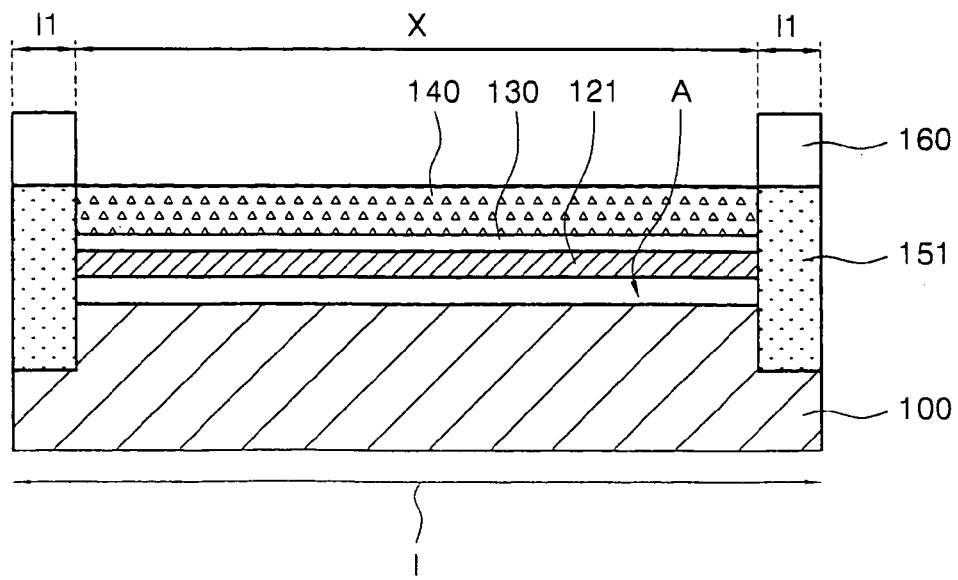
Figure 4D:
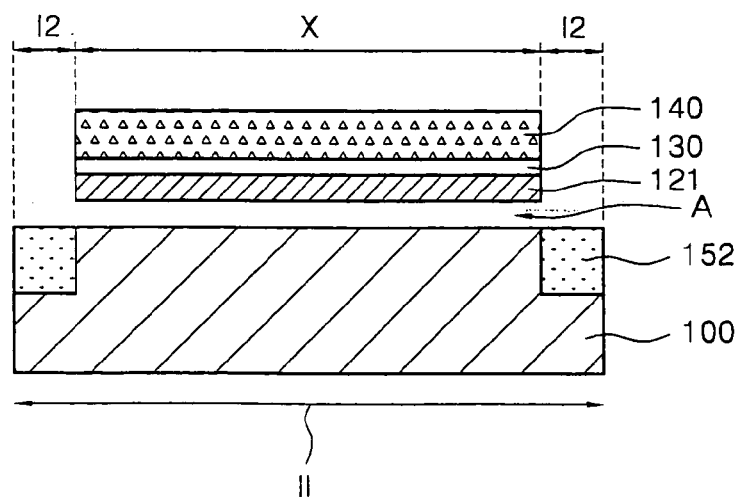

Referring to FIGS. 2D, 3D, and 4D, a mask 160 is formed to cover the insulating layer 150 of the device isolation region I1. The insulating layer 150 of the device isolation region I2 is then etched to expose at least one side of the silicon nitride layer 140, the pad oxidation layer 130, the active layer 121 and the sacrificial layer 111, which are disposed at a boundary between the active region X and the device isolation region I2. Thus, insulating layer patterns 151 and 152, obtained by patterning the insulating layer 150, are formed in the device isolation regions I1 and I2, respectively. The insulating layer pattern 151 may form a first device isolation layer.

The insulating layer pattern 151 may have the same height as the silicon nitride layer 140, and the insulating layer pattern 152 may have the same height as the substrate 100. Moreover, the insulating layer pattern 152 should not be formed by completely removing the insulating layer 150 of the device isolation region I2.

Next, the sacrificial layer 111 is removed to form a void space A between the semiconductor substrate 100 and the active layer 121. The void space A may act as an insulating layer. The insulating layer pattern 151 may act as a supporting layer for preventing collapse of the silicon nitride layer 140, the pad oxidation 130, and the active layer 121 when removing the sacrificial layer 111.

The sacrificial layer 111 may be removed by a wet etch or dry etch process. The sacrificial layer 111 may be etched under a condition having etch selectivity of 300 or more with respect to the semiconductor substrate 100 and the active layer 121. When the semiconductor substrate 100, the active layer 121 and the sacrificial layer 111 are formed of silicon, an epitaxial SiGe layer and an epitaxial Si layer, respectively, in accordance with some embodiments of the present invention, a mixed solution of $H_2O$, $HNO_3$, HF, and $CH_3COOH$ may be used as an etchant to remove the sacrificial layer 111.

Figure 3E:
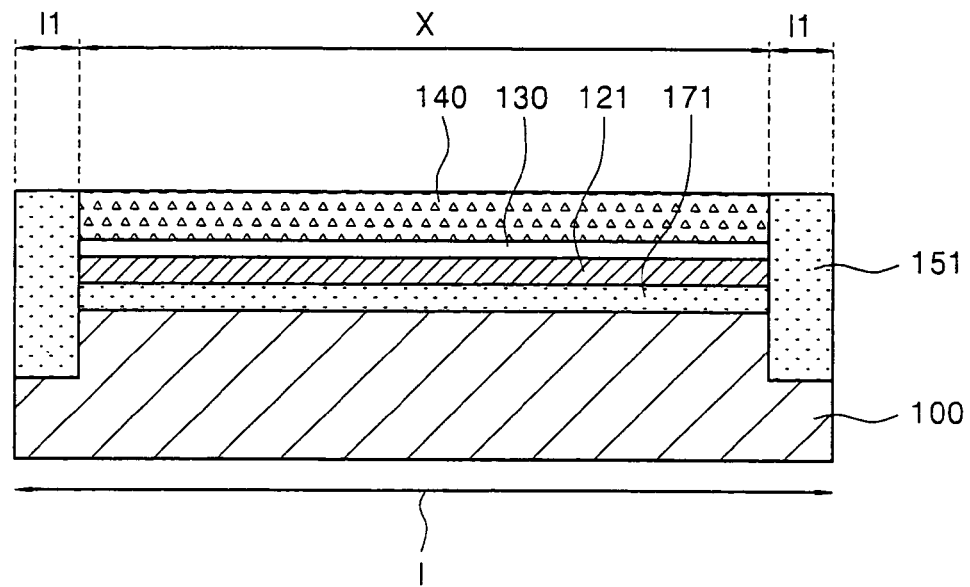
Figure 4E:
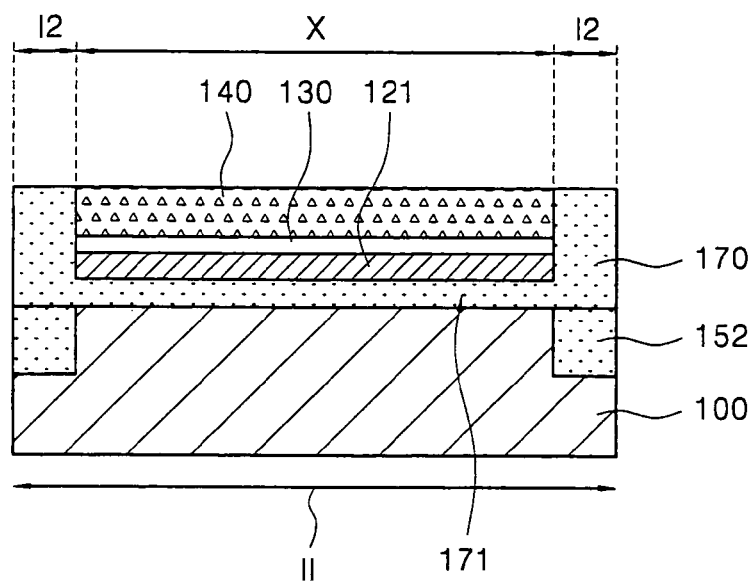

Referring to FIGS. 2E, 3E, and 4E, the mask 160 is removed, and an insulating layer 170 is formed on the insulating layer pattern 152 of the device isolation region I2, which becomes a second device isolation layer. The insulating layer 170 may be formed by the same method as the insulating layer 150. As the insulating layer 170 is formed, the sides of the silicon nitride layer 140, the pad oxidation layer 130, and the active layer 121 that have been exposed, are covered by the insulating layer 170. The insulating layer 170 may also act as a supporting layer for preventing possible collapse of the active layer 121. Thus, the active layer 121 defining the active region X is surrounded by the insulating layer 170 formed as the second device isolation layer, and the insulating layer pattern 151 formed as the first device isolation layer.

In addition, as shown in FIGS. 3E and 4E, the void space A may be at least partially filled with an insulating layer 171 formed between the semiconductor substrate 100 and the active layer 121 during a process of forming the insulating layer 170. These insulating layers 170 and 171 may be a single layer or a stacked layer comprising two or more kinds of insulating layers. The stacked layer may include an oxide layer and a nitride layer. When the insulating layer 171 is formed of an oxide layer, a lower surface of the active layer 121 and some portions of the semiconductor substrate 100 may be consumed to thereby reduce the thickness of the active layer 121 and the substrate 100.

Moreover, the insulating layer 171 may be formed so that the void space A remains and acts as an insulating layer. Alternatively, the void space A may not be completely filled with the insulating layer so that thermal oxidation layers are formed on an upper surface of the semiconductor substrate 100 and on the lower surface of the active layer 121 to thereby surround upper and lower portions of the void space A with the thermal oxidation layers. In other embodiments of the present invention to be described later, a method for leaving the void space A residual and a method for forming the thermal oxidation layers will be described.

Figure 2F:
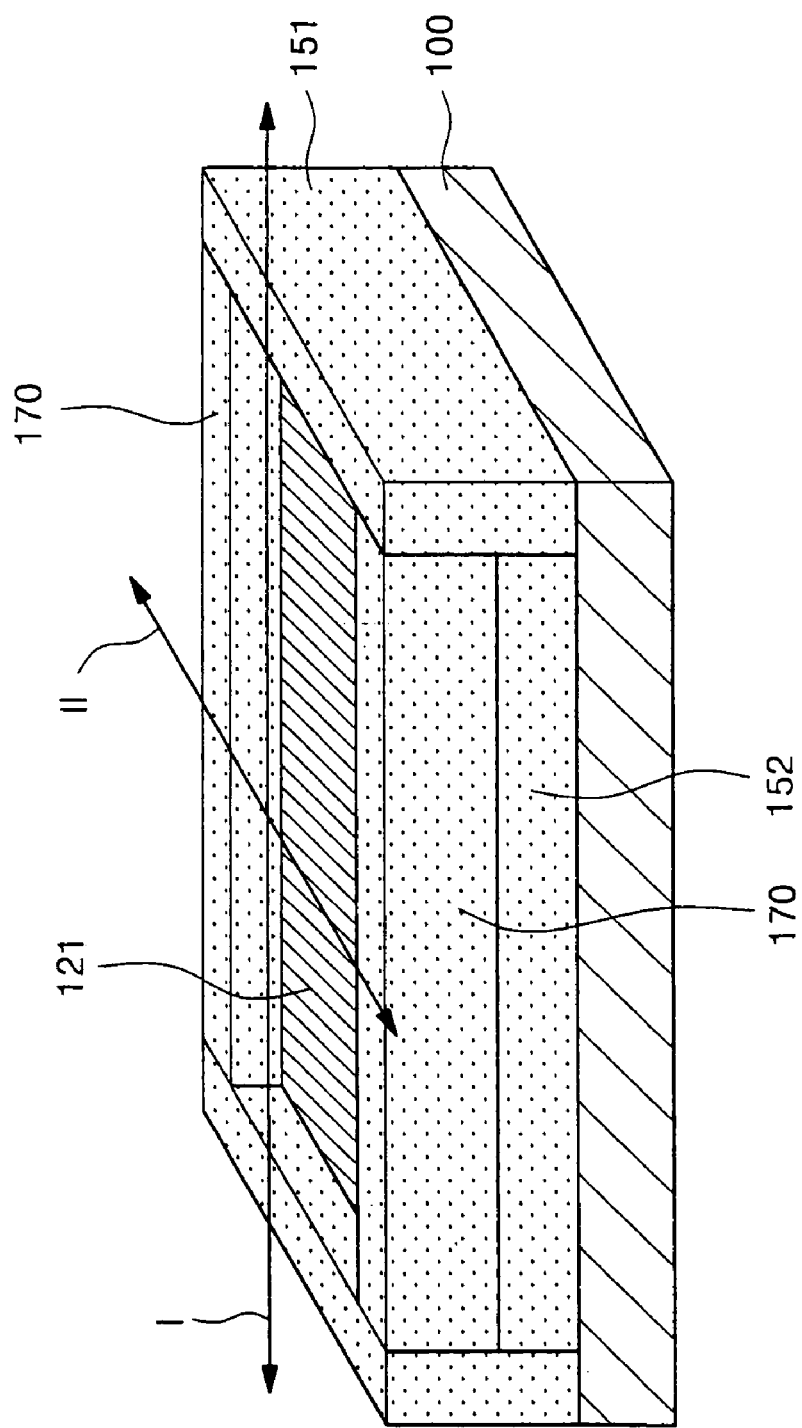
Figure 3F:
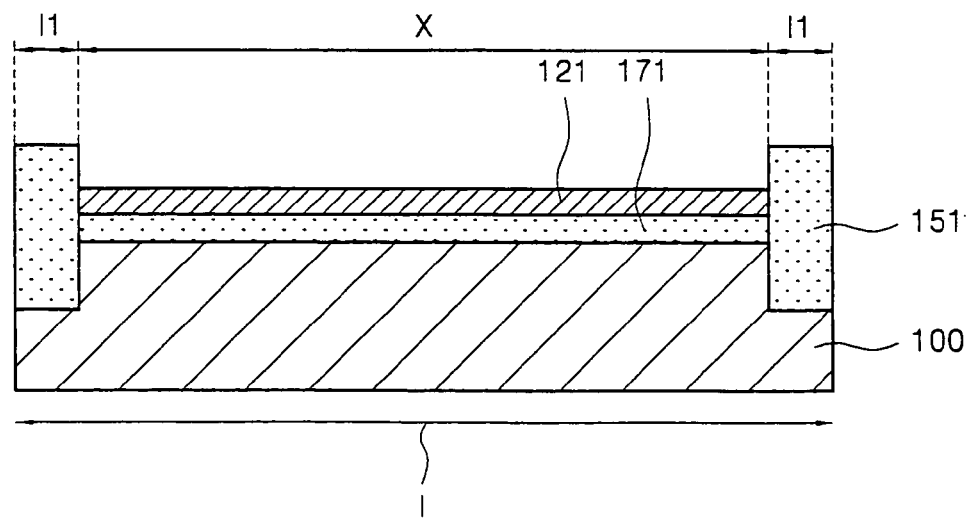
Figure 4F:
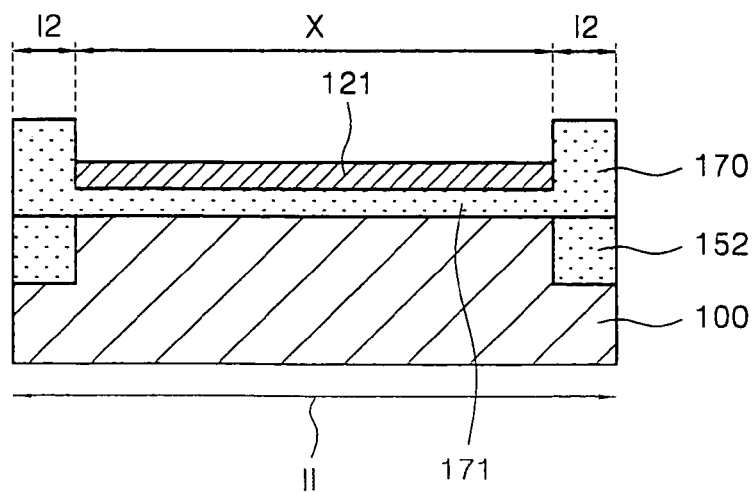

Referring to FIGS. 2F, 3F, and 4F, the silicon nitride layer 140 and the pad oxidation layer 130 are removed to expose the upper surface of the active layer 121. Thus, an SOI substrate including the semiconductor substrate 100, the insulating layer 171, and the active layer 121 is completed.

The process of patterning the sacrificial layer and the active layer may be omitted in the above-mentioned embodiments of the present invention. In other words, in order to obtain the structure shown in FIGS. 2C, 3C, and 4C, a conventional STI (shallow trench isolation) technique may be employed to form the insulating layer 150 on the substrate 100 of the device isolation regions I1 and I2. The sacrificial layer 111 and the active layer 121 are then epitaxially grown in sequence on the exposed substrate 100 after forming the insulating layer 150 to thereby contact a side of the insulating layer 150 with the sides of the sacrificial layer 110 and the active layer 120. Next, the pad oxidation layer 130 and the silicon nitride layer 140 may be formed as a passivation layer on the active layer 120. Processes as shown in FIGS. 2D to 2F are then performed.

In accordance with the above-mentioned embodiments of the present invention, processes of bonding, isolating, polishing a wafer, and the like may be omitted. Therefore, the active layer may be grown with a minimum thickness and can be controlled from being consumed. In addition, it may not be necessary to form a thick active layer so that an active layer having a uniform thickness can be formed on a wafer of a large diameter.

Moreover, when the active layer is formed to have a thickness that exceeds a desired thickness, the thickness of the active layer may be reduced by repeatedly forming and removing a thermal oxidation layer. Alternatively, the thickness of the active layer may be reduced by performing an etching process.

Hereinafter, methods for reducing the thickness of the active layer using processes of forming and removing a thermal oxidation layer will be described with reference to FIGS. 5A to 5C.

Figure 5A:
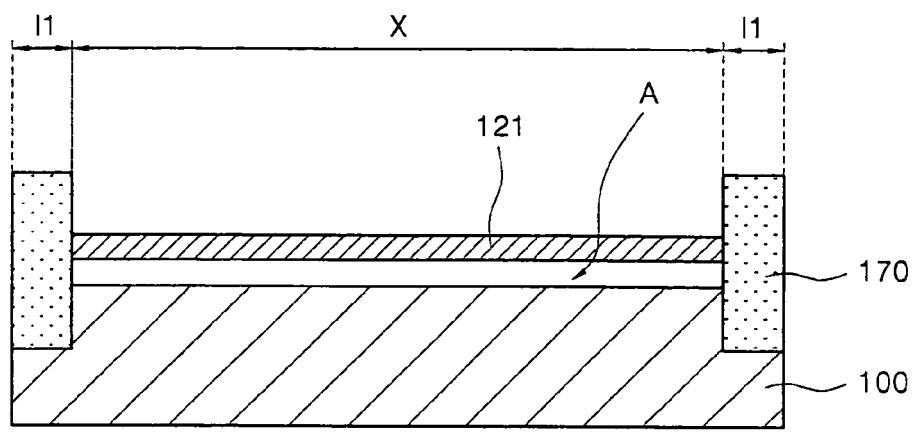
FIGS. 5A-5C show cross-sectional views for explaining a method for fabricating an SOI substrate in accordance with other embodiments of the present invention.

Referring to FIG. 5A, an SOI substrate fabricated by one or more of the above-mentioned embodiments is prepared.

In particular, FIG. 5A shows an SON (silicon-on-nothing) substrate having the void space A between the active layer 121 and the semiconductor substrate 100, which is one type of SOI substrate.

Figure 5B:
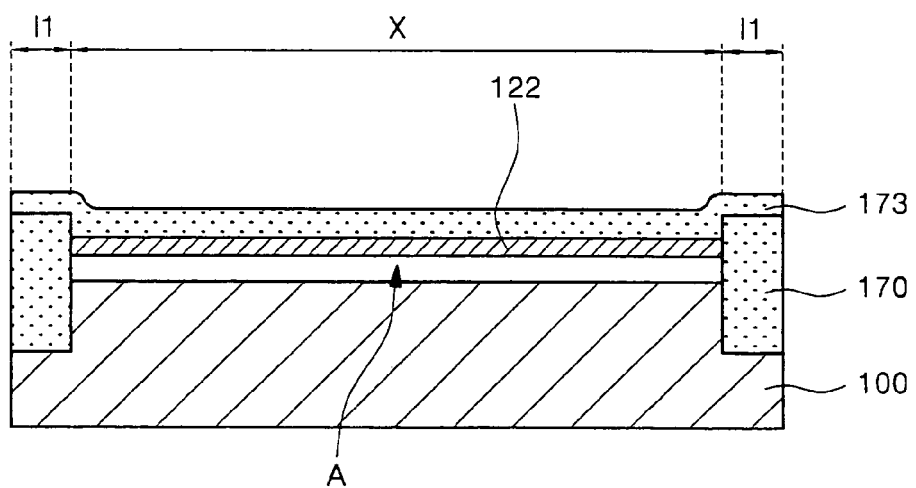

Referring to FIG. 5B, a thermal oxidation layer 173 is formed on the active layer 121. As the thermal oxidation layer 173 is formed, some surfaces of the active layer 121 are consumed to thereby obtain a thinner active layer 122.

Figure 5C:
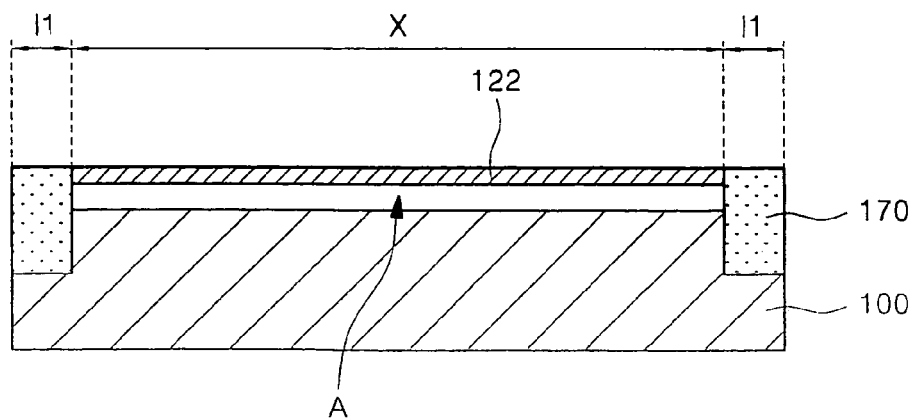

Referring to FIG. 5C, the thermal oxidation layer 173 is removed to expose the active layer 122. In this case, the insulating layer 170 may be removed up to a height of the active layer 122.

In the above process, a desired thickness of the active layer 122 may be obtained by adjusting the number of times and/or the time for formation of the thermal oxidation layer 173.

FIGS. 6A to 6F show perspective views for explaining methods for fabricating SOI substrates in accordance with other embodiments of the present invention. In addition, FIGS. 7A to 7F show vertical cross-sectional views taken along line III of FIGS. 6A to 6F, and FIGS. 8A to 8E show vertical cross-sectional views taken along line IV of FIGS. 6A, 6C, 6D, 6E and 6F, respectively.

Figure 6A:
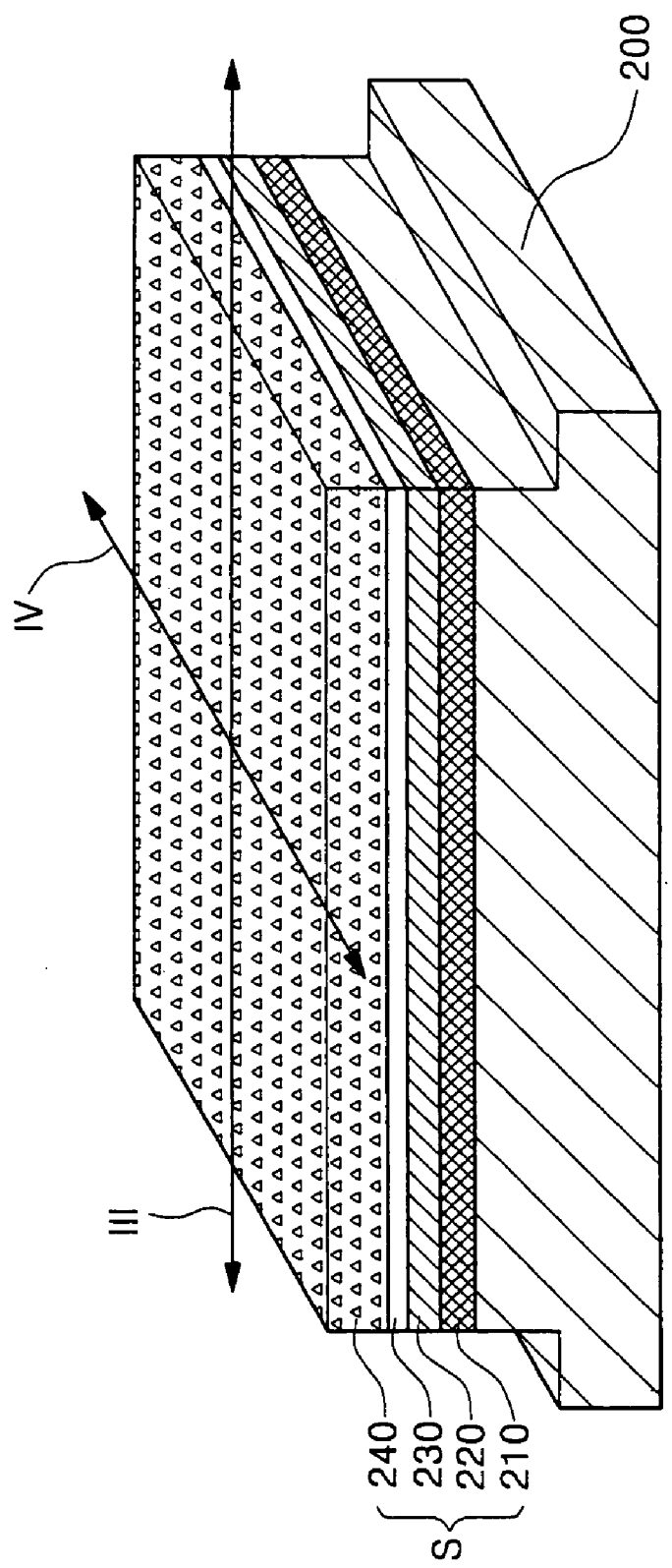
FIGS. 6A to 6F show perspective views for explaining methods for fabricating SOI substrates in accordance with other embodiments of the present invention.
Figure 7A:
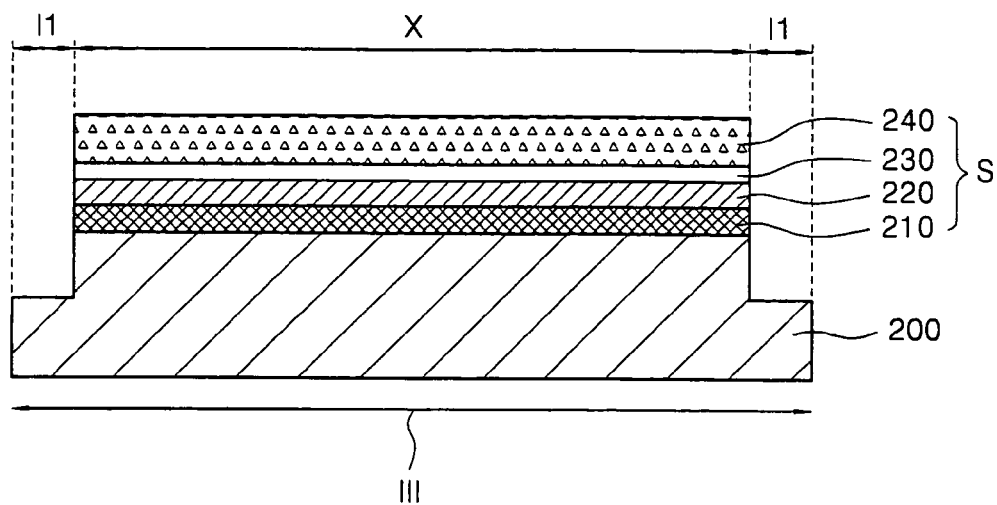
FIGS. 7A to 7F show vertical cross-sectional views taken along line III of FIGS. 6A to 6F.
Figure 8A:
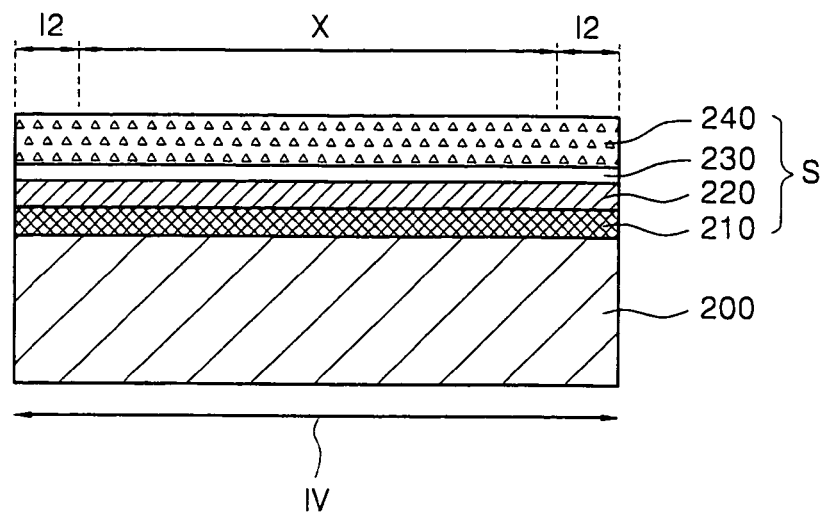
FIGS. 8A to 8E show vertical cross-sectional views taken along line IV of FIGS. 6A, 6C, 6D, 6E and 6F, respectively.

Referring to FIGS. 6A, 7A, and 8A, a stack pattern S is formed on a substrate 200 such as a semiconductor substrate, wherein the stack pattern S comprises a silicon nitride layer 240, a pad oxidation layer 230, an active layer 220 and a sacrificial layer 210. The stack pattern S covers the substrate 200 on an active region X and a device isolation region I1. As the stack pattern S is formed, a surface of the substrate 200 on a device isolation region I2 is exposed. Moreover, after forming the stack pattern S, some portions of the substrate 200 may be etched.

Figure 6B:
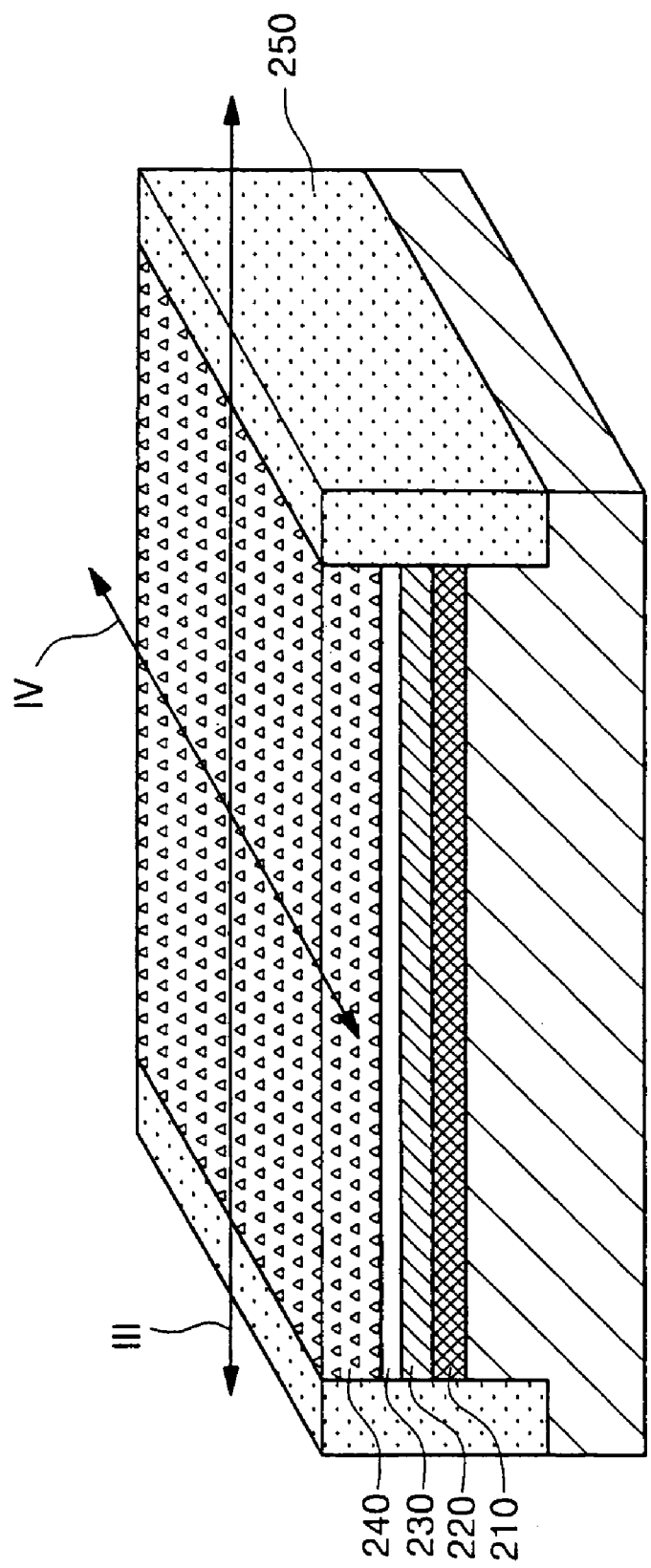
Figure 7B:
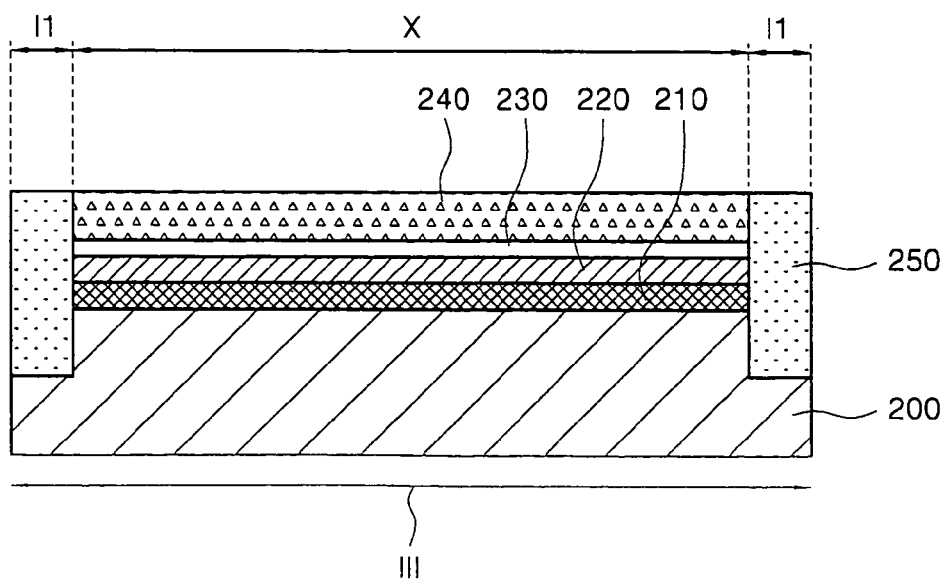

Referring to FIGS. 6B and 7B, an insulating layer 250 is formed as a first device isolation layer on the substrate 200 of the device isolation region I1. Thus, a side of the stack pattern S formed on a boundary between the active region X and the device isolation region I1, comes in contact with the insulating layer 250.

Figure 6C:
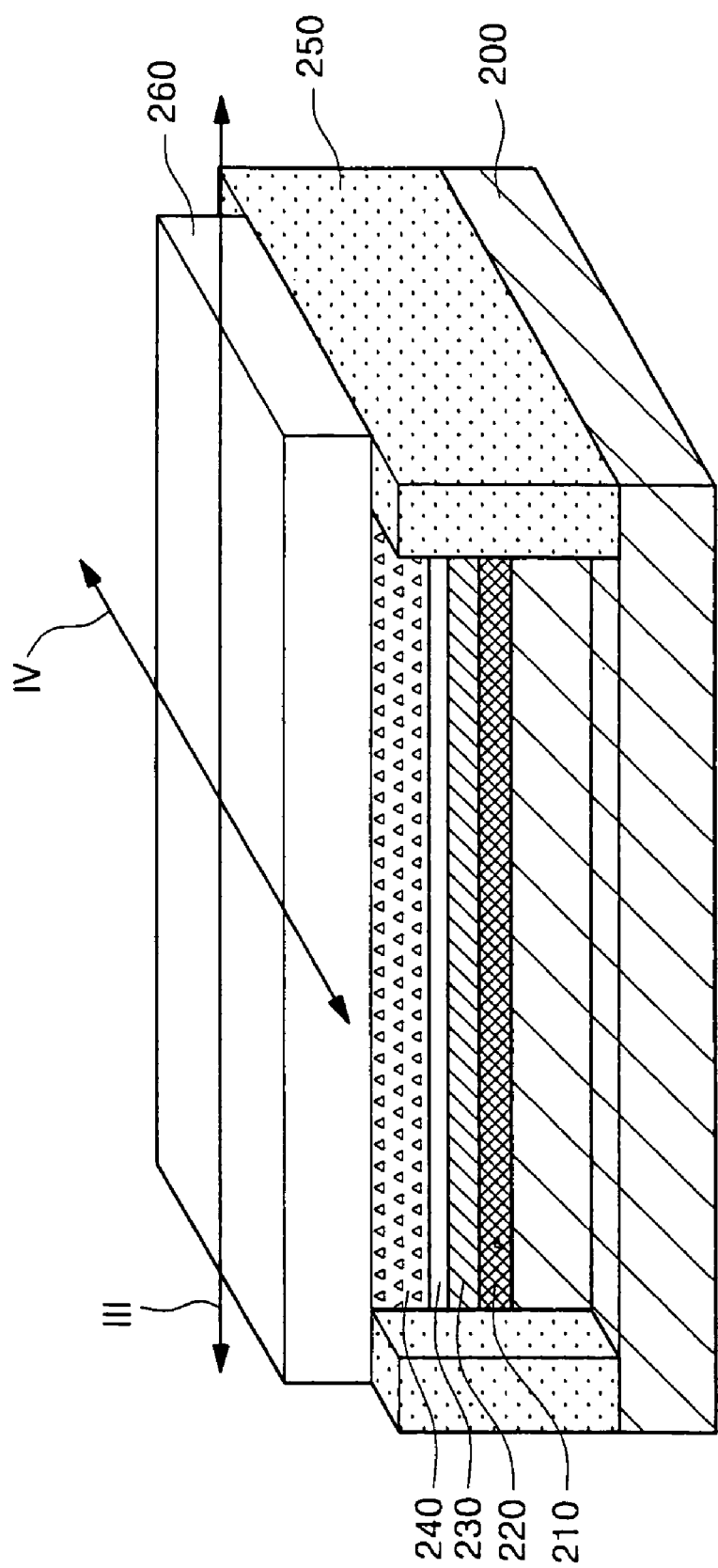
Figure 7C:
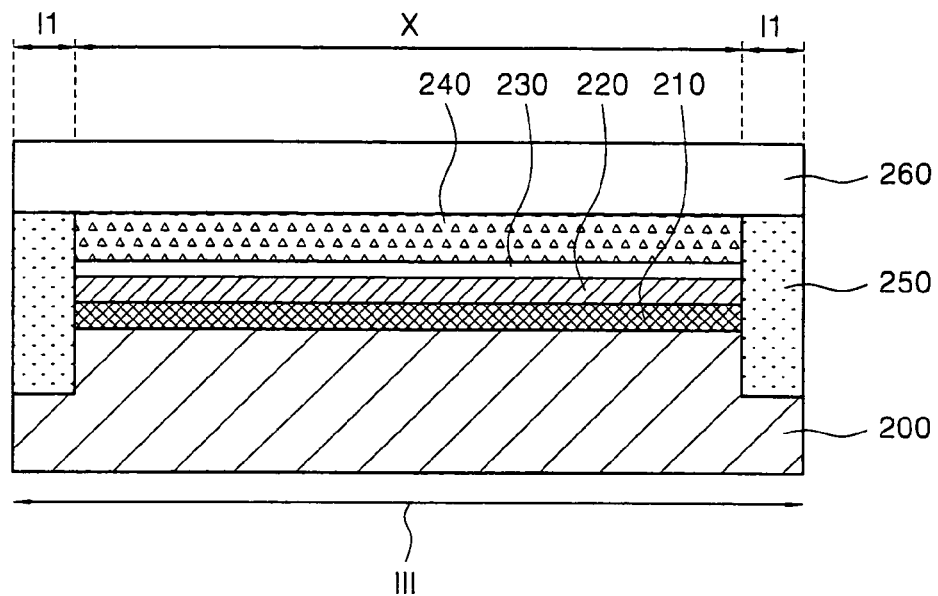
Figure 8B:
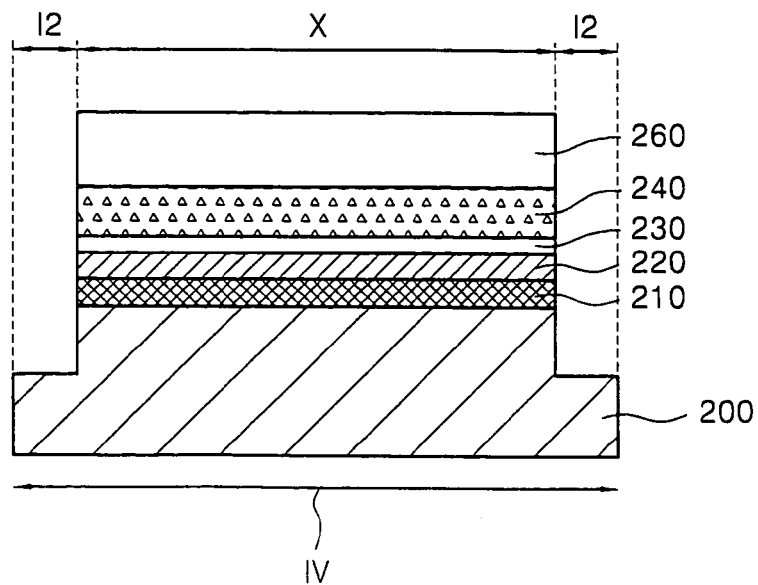

Referring to FIGS. 6C, 7C, and 8B, a mask 260 is formed to cover the active region X and the insulating layer 250 in contact with the active region X. The silicon nitride layer 240, the pad oxidation layer 230, the active layer 220 and the sacrificial layer 210 are then patterned. Thus, at least one side of the silicon nitride layer 240, the pad oxidation layer 230, the active layer 220 and the sacrificial layer 210, which have been disposed at a boundary between the active region X and the device isolation region I2, is exposed. Moreover, while patterning the active layer 220 and the sacrificial layer 210, some portions of the substrate 200 may be etched as shown in FIGS. 7C and 8B.

Figure 6D:
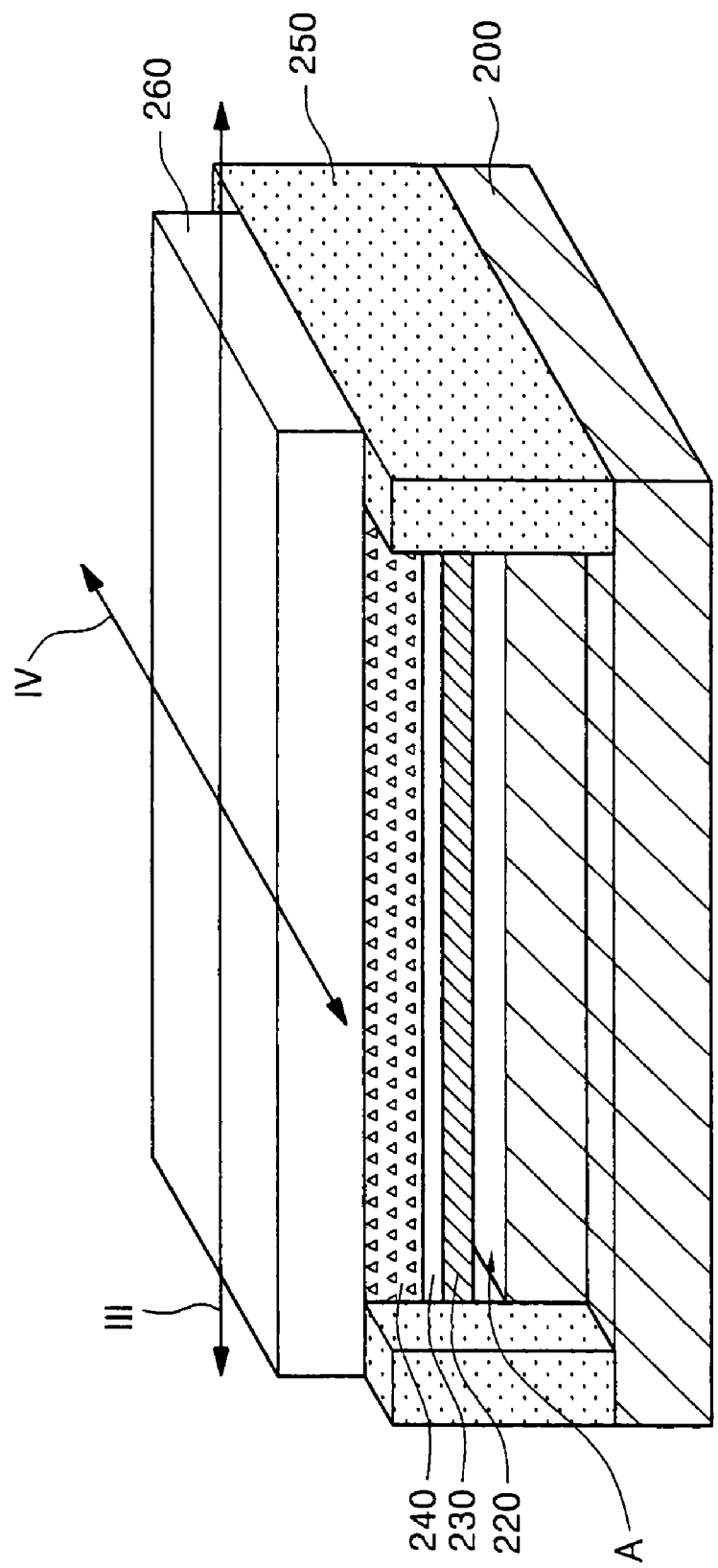
Figure 7D:
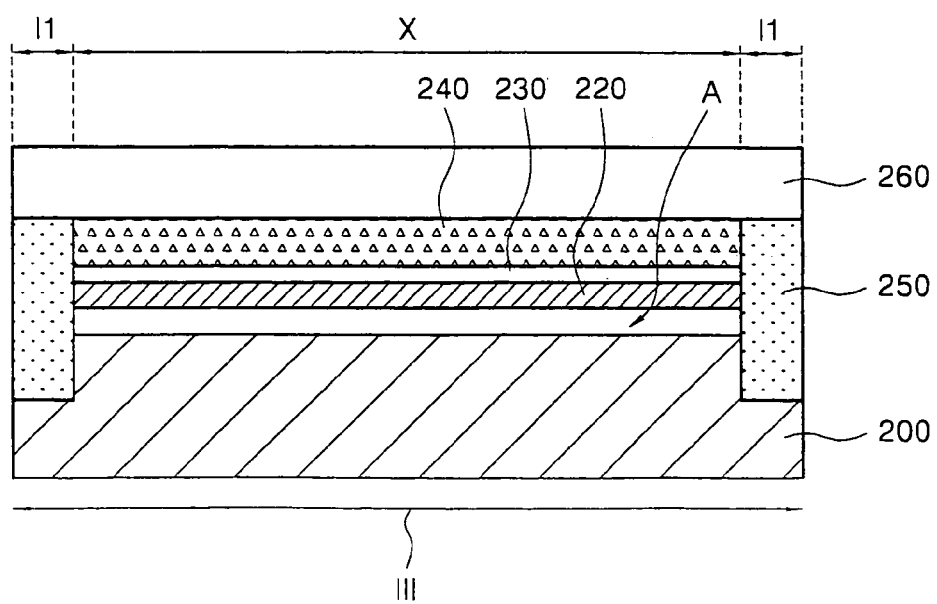
Figure 8C:
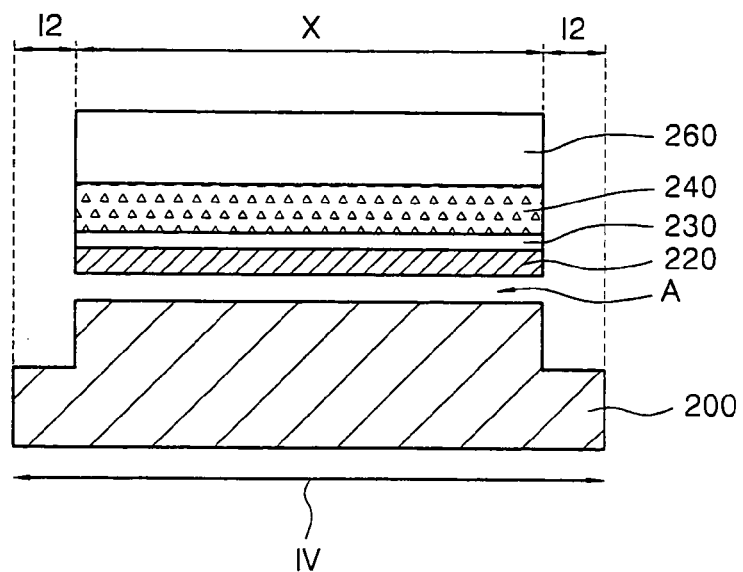

Referring to FIGS. 6D, 7D, and 8C, the sacrificial layer 210 is removed to form a void space A between the substrate 200 and the active layer 220. In this case, the insulating layer 250 acts as a supporting layer that can prevent collapse of the silicon nitride layer 240, the pad oxidation layer 230, and the active layer 220.

Figure 6E:
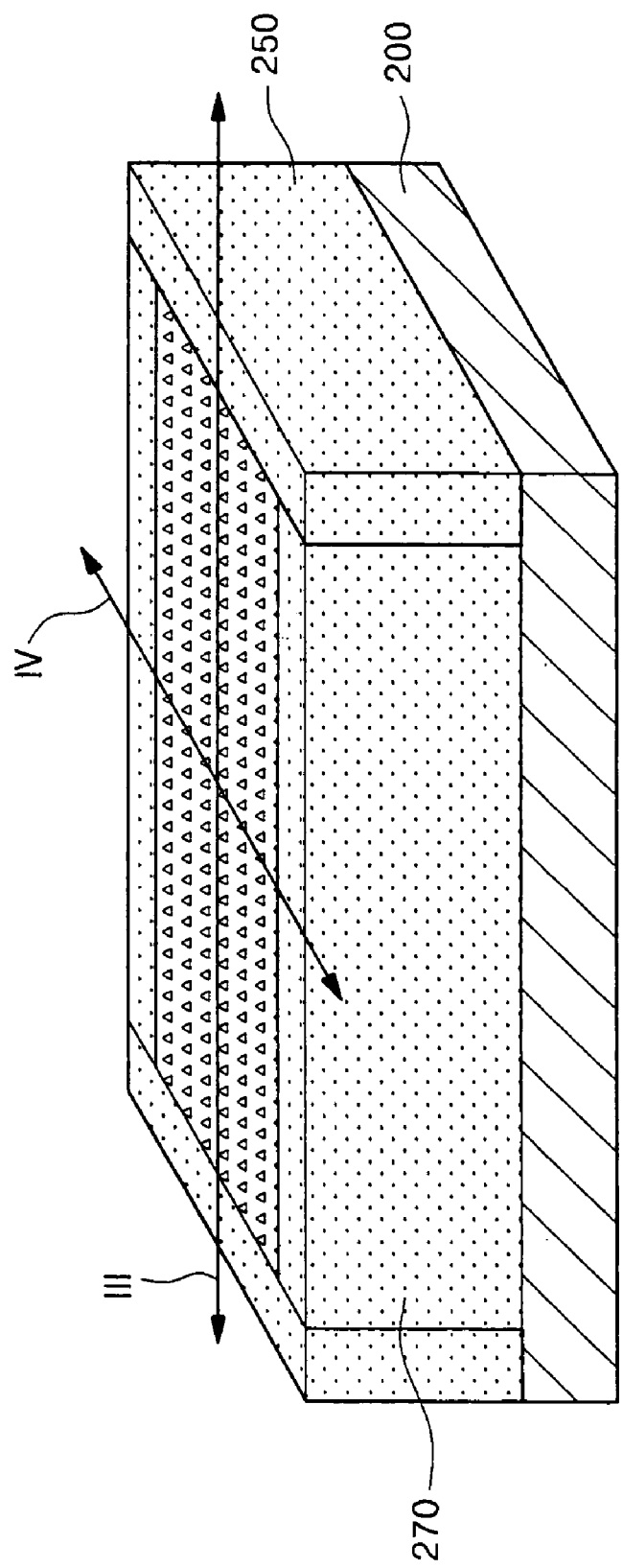
Figure 7E:
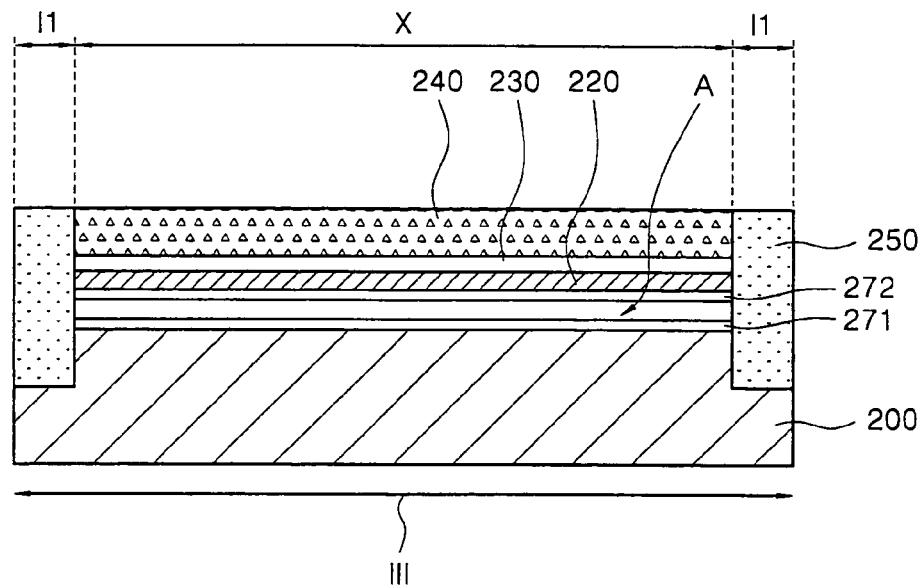
Figure 8D:
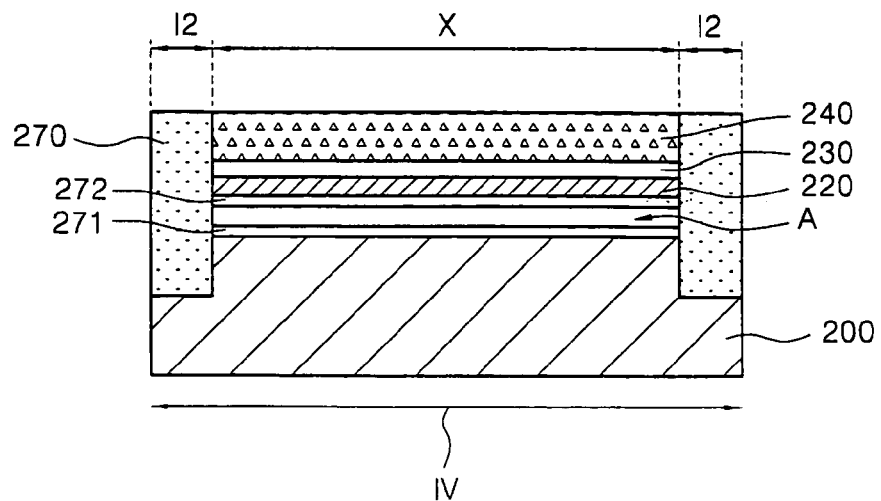

Referring to FIGS. 6E, 7E, and 8D, the mask 260 is removed and an insulating layer 270 is formed as a second device isolation layer on the substrate 200 on the device isolation region I2. Thus, sides of the silicon nitride layer 240, the pad oxidation layer 230, the active layer 220, and the void space A are covered with the insulating layer 270. Moreover, the active layer 220 forming the active region X is surrounded by the insulating layer 250 formed as the first device isolation layer, and the insulating layer 270 formed as the second device isolation layer. To leave the void space A residual, the insulating layer 270 should not be formed in the void space during the process of forming the insulating layer 270. Thus, the insulating layer 270 may be formed by an evaporation method. In addition, in order to enhance directionality of a deposition source, the insulating layer 270 may be formed under a high vacuum condition of $10^{-6}$ Torr or less.

In the meantime, a thermal oxidation layer 271 and a thermal oxidation layer 272 may be formed on an upper surface of the semiconductor substrate 200 and a lower surface of the active layer 220, respectively after forming the void space A. Thus, the thermal oxidation layer 272 that provides an insulating layer, and the active layer 220 that provides an Si epitaxial layer, are stacked on the void space A so that an SOION (SOI-on-nothing) substrate may be obtained, which is one type of SOI substrate. The thermal oxidation layers 271 and 272 may act as a passivation layer for the active layer and the semiconductor substrate.

In addition, in accordance with above-mentioned embodiments of the present invention, the void space A between the substrate 200 and the active layer 220 may be completely filled with the insulating layer 270 during the process of forming the same.

Figure 6F:
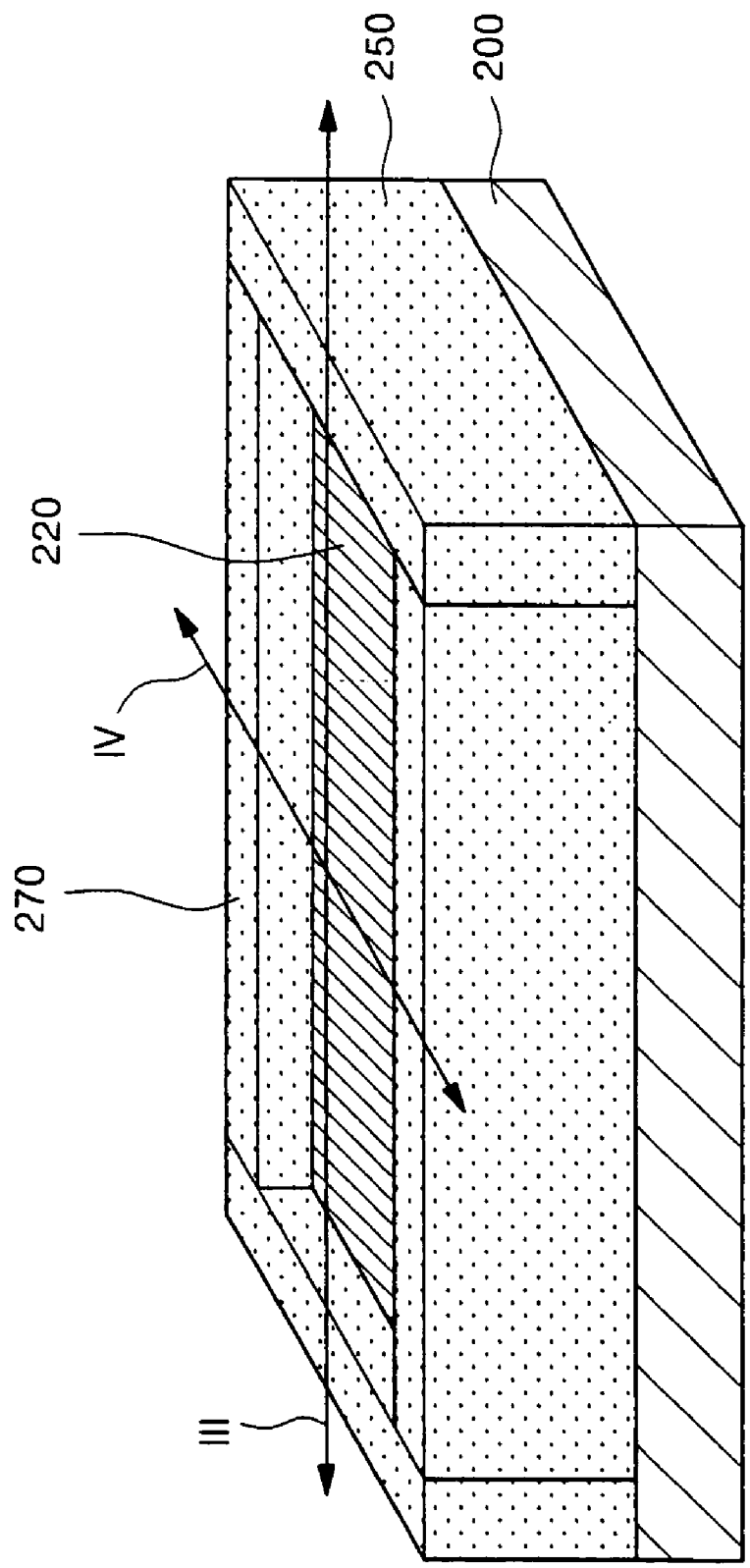
Figure 7F:
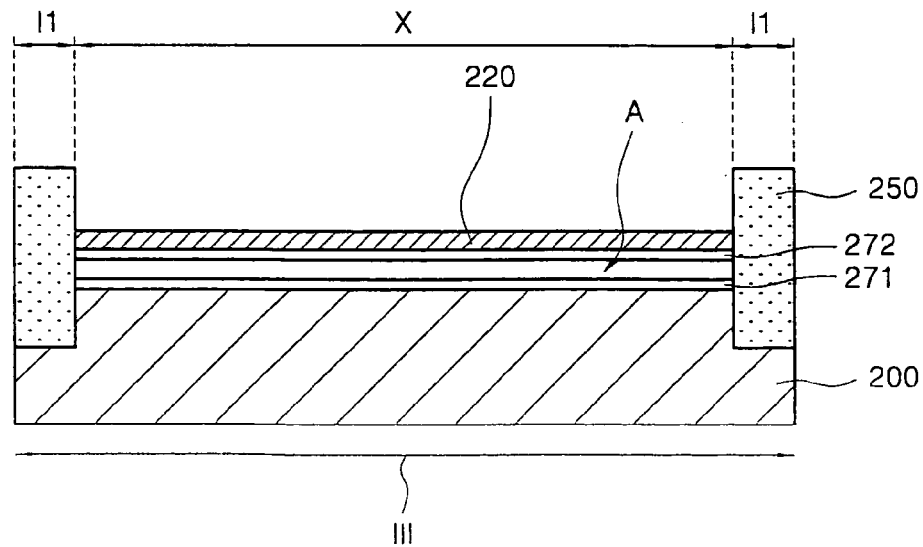
Figure 8E:
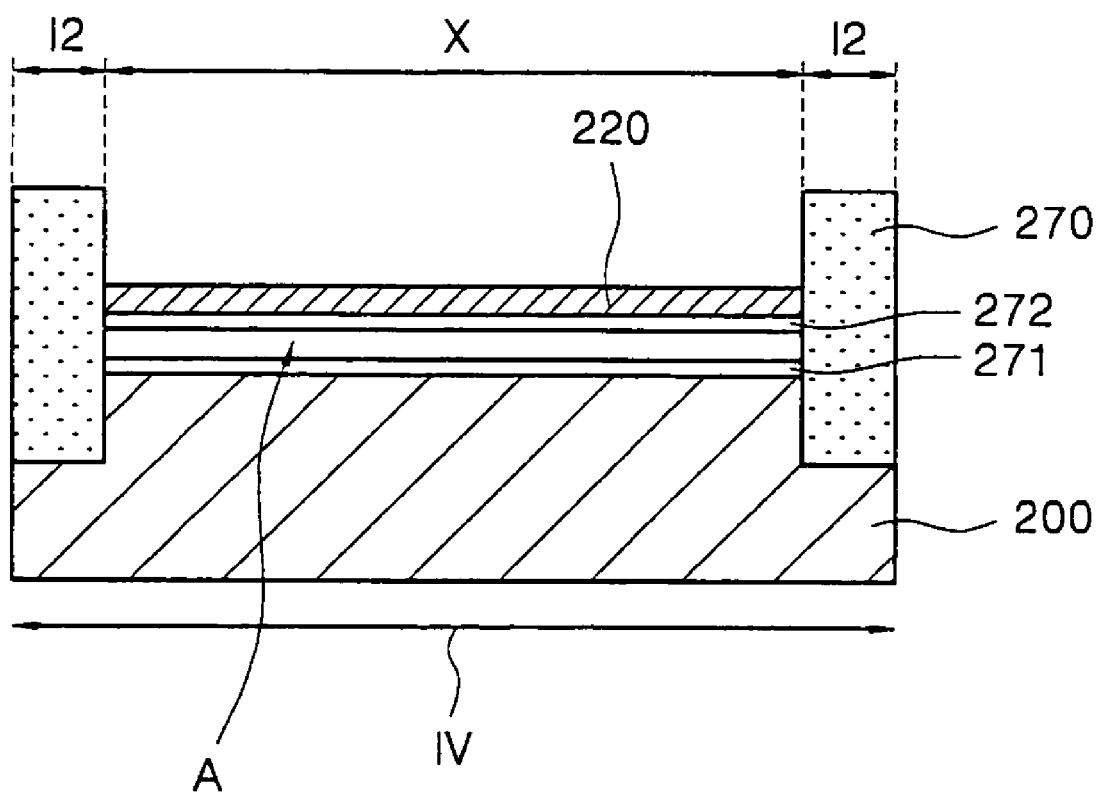

Referring to FIGS. 6F, 7F, and 8E, the silicon nitride layer 240 and the pad oxidation layer 230 are removed to expose the active layer 220.

The thickness of the active layer may be reduced by forming and removing the thermal oxidation layer on the active layer, and/or etching the active layer.

Moreover, the process of patterning the sacrificial layer and the active layer may be omitted in some embodiments of the present invention. In other words, to obtain the structure as shown in FIGS. 6B, 7B, and 8A, an STI process may be performed to form the insulating layer 250 on the substrate 200 of the device isolation region I1. The sacrificial layer 210 and the active layer 220 are then epitaxially grown on the exposed substrate 200 to have some sides of the sacrificial layer 210 and active layer 220 contacting the insulating layer 250. Next, the pad oxidation layer 230 and the silicon nitride layer 240 may be formed as a passivation layer on the sacrificial layer 220. Then, processes as shown in FIGS. 6C to 6E may be performed.

A process of forming a transistor may be performed after forming the SOI substrate in accordance with the above-mentioned embodiments of the present invention.

Figure 9A:
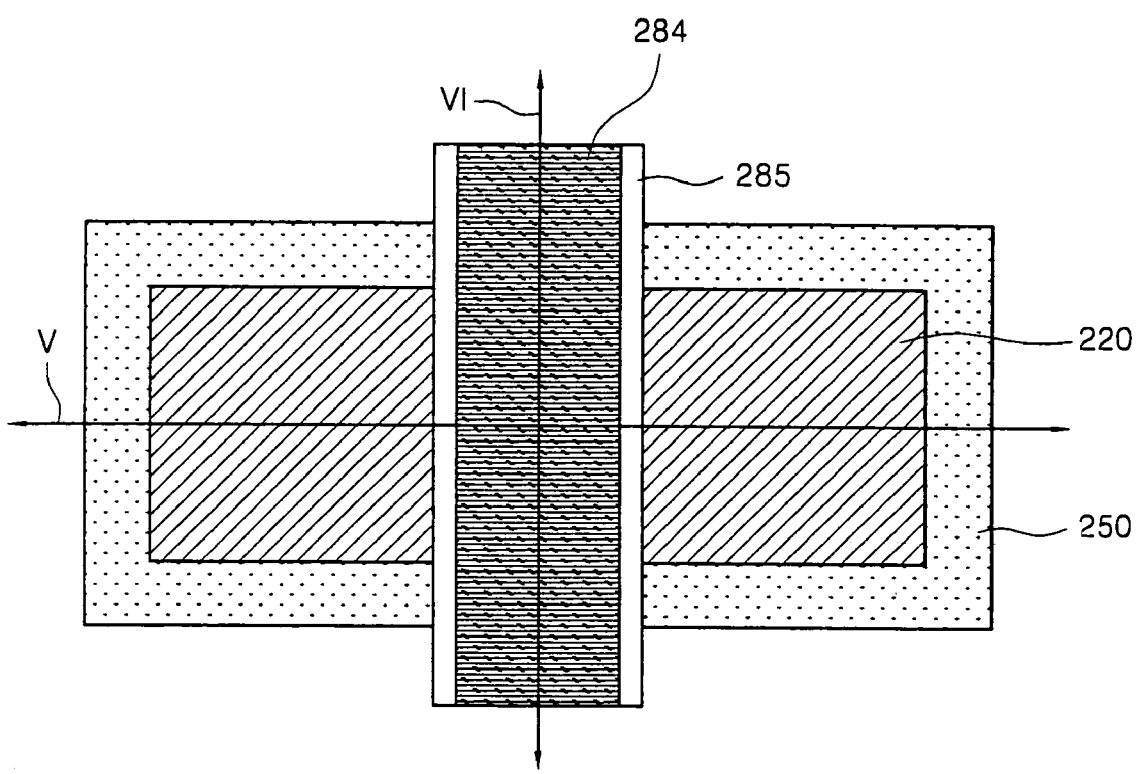
FIG. 9A shows a plan view for explaining methods for fabricating semiconductor devices in accordance with other embodiments of the present invention.

FIG. 9A shows a plan view for explaining methods for fabricating semiconductor devices in accordance with other embodiments of the present invention. In addition, FIGS. 9B and 9C show vertical cross-sectional views taken along lines V and VI of FIG. 9A, respectively.

Figure 9B:
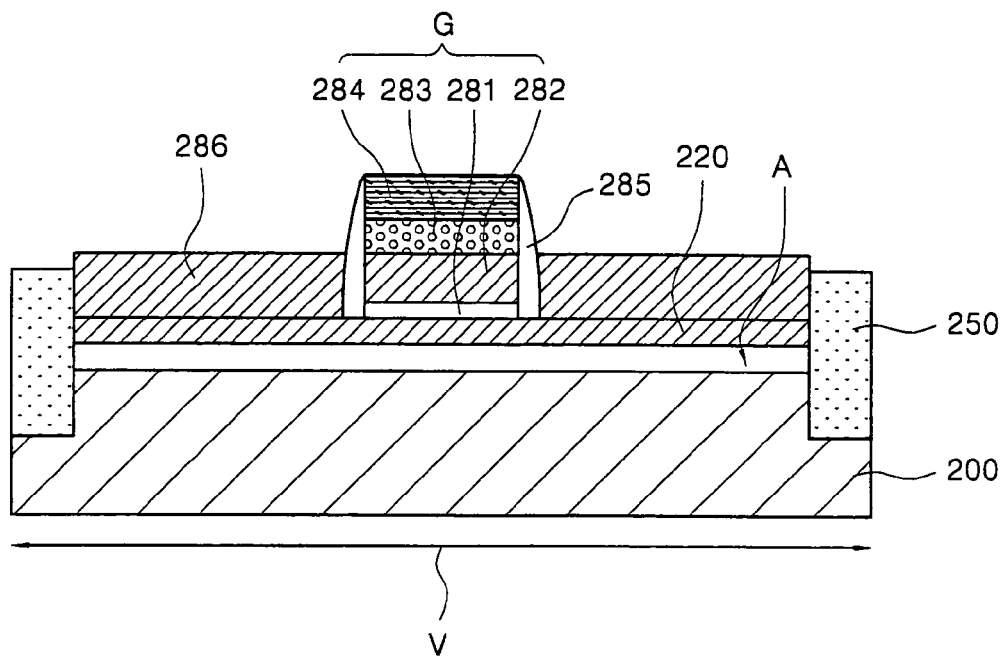
FIGS. 9B and 9C show vertical cross-sectional views taken along lines V and VI of FIG. 9A, respectively.
Figure 9C:
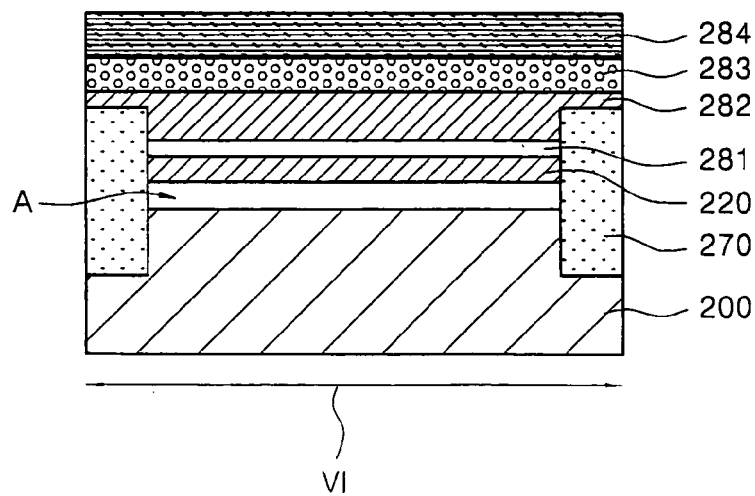

Referring to FIGS. 9A to 9C, as shown in FIGS. 6F, 7F, and 8E of the above-mentioned embodiments, an SOI substrate having a void space A between the substrate 200 and the active layer 220 is prepared. The void space A may be filled with an insulating layer. Alternatively, thermal oxidation layers may be formed on a lower surface of the active layer 220 and on an upper surface of the substrate 200. A gate pattern G is then formed on the active layer 220, wherein the gate pattern G includes a gate oxidation layer 281, a polysilicon layer 282, a silicide layer 283 and a mask insulating layer 284, which are sequentially stacked. An insulating layer spacer 285 is then formed on a side of the gate pattern G. A process of forming source/drain is performed. As shown in FIG. 9B, an epitaxial layer may be grown on the active layer 121 to form an elevated source/drain 286. Alternatively, the source/drain may be formed by implanting ions within the active layer 220 at both ends of the gate pattern G. Other conventional techniques may be used.

Figure 10:
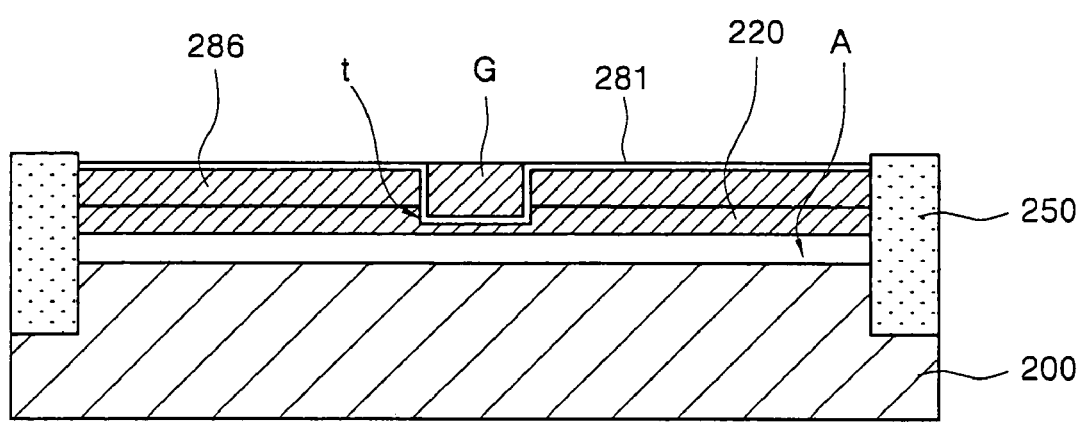
FIG. 10 shows a cross-sectional view for explaining methods for fabricating semiconductor devices in accordance with other embodiments of the present invention.

The gate pattern G may be formed within the active layer. Referring to FIG. 10, the SOI substrate having the void space A between the substrate 200 and the active layer 220 is prepared, and the active layer 220 is selectively etched to form a trench (t) within the active layer 220. The gate oxidation layer 281 is then formed on the active layer 220. The trench (t) is then filled with a conductive layer to form the gate pattern G. The source/drain 286 may be formed by implanting ions within the active layer 220 at both ends of the gate pattern G. Alternatively, the elevated source/drain may be formed as shown in FIG. 9B.

The gate pattern G may be formed by the process of forming and polishing a conductive layer on the active layer 220 or by the patterning process. The gate pattern G may be formed of a single layer or stacked layers. When the gate pattern G is formed of a polysilicon layer, a metal layer may be deposited and thermally treated on the polysilicon layer to form a self-aligned silicide layer.

SOI substrates fabricated by embodiments of the present invention may be used for a process of fabricating fin FET transistors.

FIGS. 11A to 11D show plan views for explaining methods for fabricating semiconductor devices in accordance with other embodiments of the present invention. FIGS. 12A to 12E show vertical cross-sectional views taken along line VII of FIGS. 11A, 11B, 11B, 11C, and 11D, respectively. FIGS. 13A to 13E show vertical cross-sectional views taken along line VIII of FIGS. 11A, 11B, 11B, 11C, and 11D, respectively.

Figure 11A:
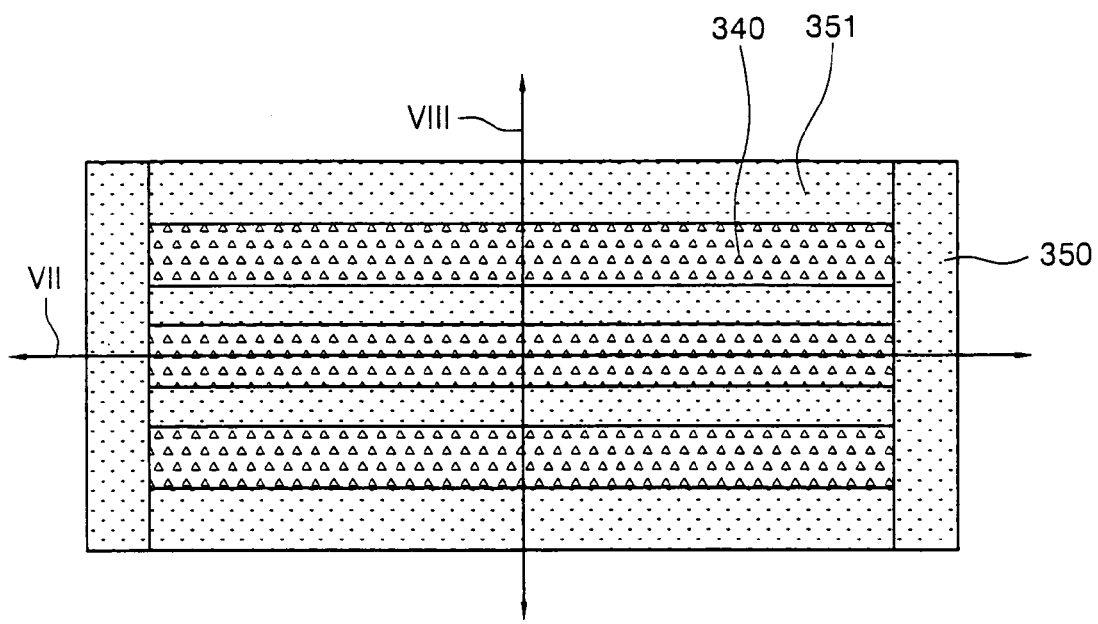
FIGS. 11A to 11D show plan views for explaining methods for fabricating semiconductor devices in accordance with other embodiments of the present invention.
Figure 12A:
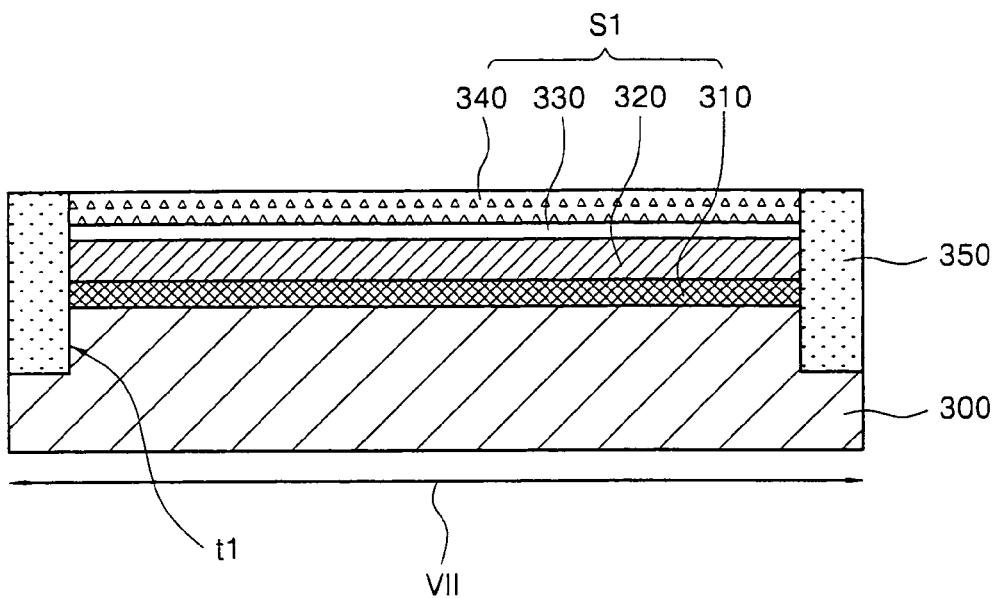
FIGS. 12A to 12E show vertical cross-sectional views taken along line VII of FIGS. 11A, 11B, 11B, 11C, and 11D, respectively.
Figure 13A:
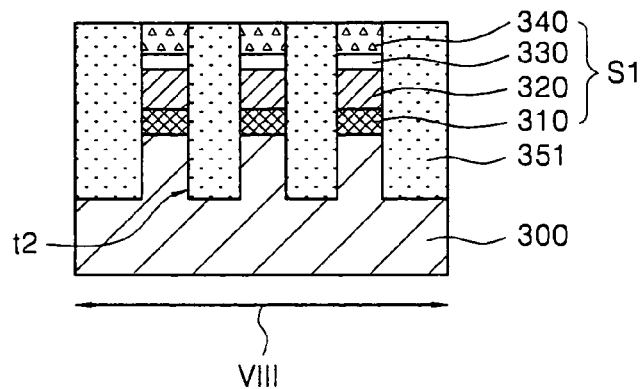
FIGS. 13A to 13E show vertical cross-sectional views taken along line VIII of FIGS. 11A, 11B, 11B, 11C, and 11D, respectively.

Referring to FIGS. 11A, 12A, and 13A, at least one stack pattern S1 including a sacrificial layer 310, an active layer 320, a pad oxidation layer 330 and a silicon nitride layer 340 is formed on a substrate 300 such as a semiconductor substrate. Trenches (t1, t2) are formed on the substrate 300 as shown in FIGS. 11A and 12A while forming a plurality of the stack pattern S1. The trench t1 is formed within the substrate 300 at both ends of the stack patterns S1, and the trench t2 is formed within the substrate 300 between the adjacent stack patterns S1.

An insulating layer 350 is formed to fill the trench t1 and extended from the trench t1 to be in contact with all ends of the stack patterns S1. At the same time, an insulating layer 351 is also formed to fill the trench t2 and portions between the adjacent stack patterns S1. These insulating layers 350 and 351 may be formed of single layers, or a stack layer formed of at least two kinds of insulating layers. The insulating layers 350 and 351 may act as first and second device isolation layers, respectively.

Figure 11B:
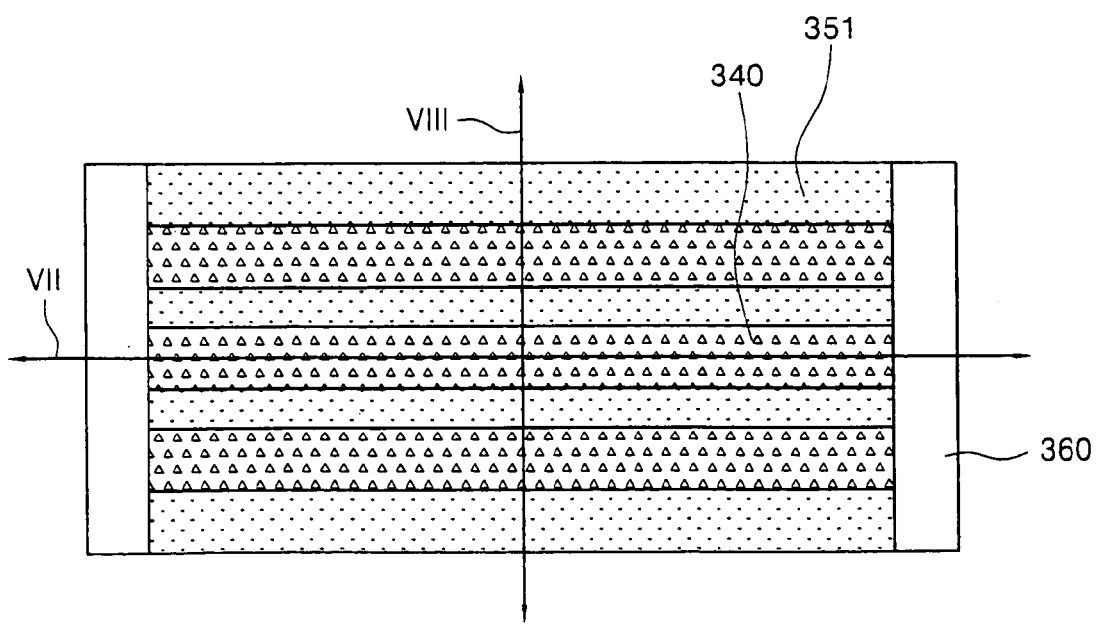
Figure 12B:
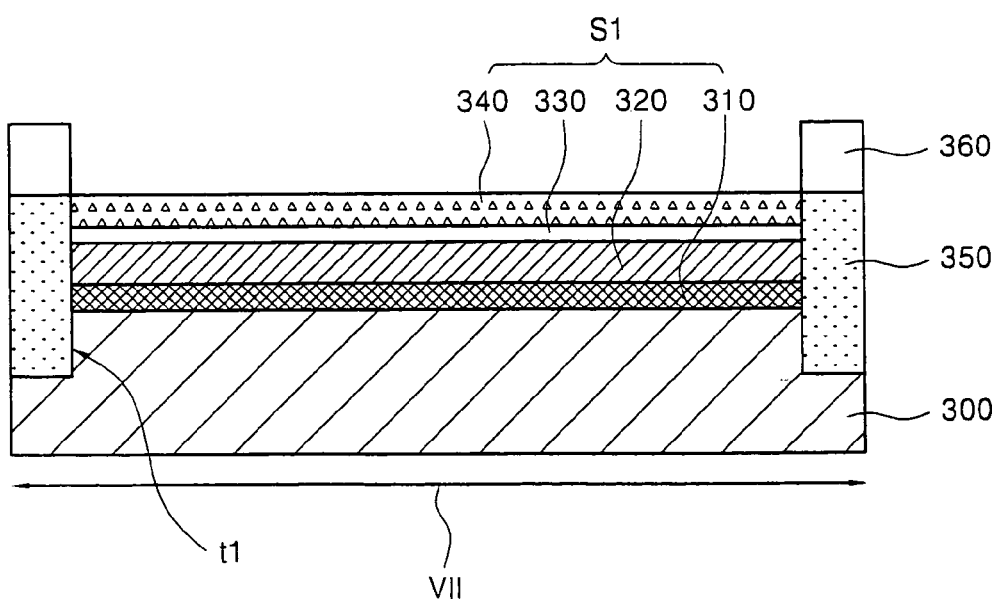
Figure 13B:
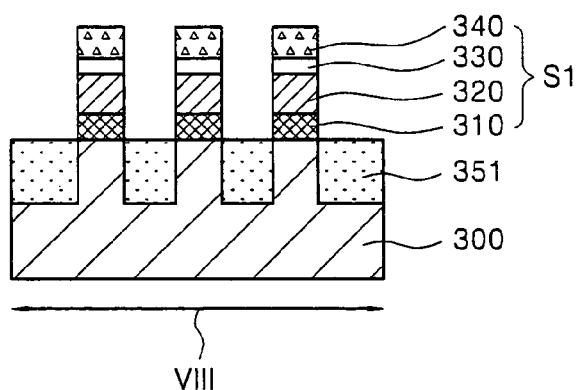

Referring to FIGS. 11B, 12B, and 13B, a mask 360 is formed to cover the insulating layer 350. The insulating layer 351 is then removed at least up to a height where the stack pattern S1 is exposed.

Figure 12C:
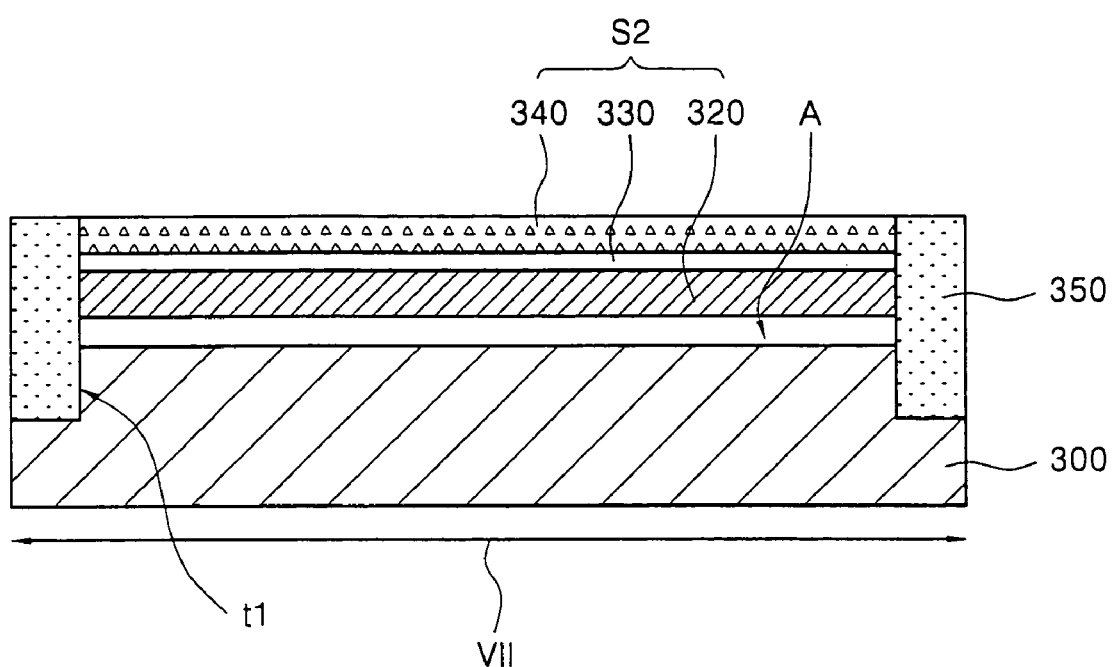
Figure 13C:
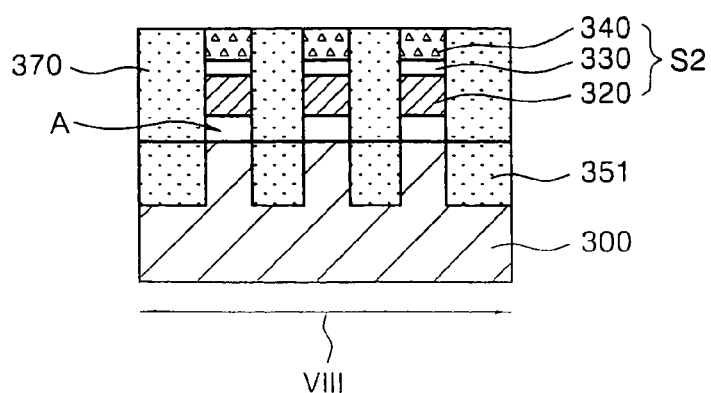

Referring to FIGS. 12C and 13C, the sacrificial layer 310 is removed. In this case, the insulating layer 350 acts as a supporting layer that can prevent collapse of the active layer 320, the pad oxidation layer 330, and the silicon nitride layer 340. As the sacrificial layer 310 is removed, some portions of the active layer 320, the pad oxidation 330, and the silicon nitride layer 340 remain to thereby form a stack pattern S2.

An insulating layer 370 is then formed on the insulating layer 351 to fill a void space within the stack pattern S2. An insulating layer may also be formed between the substrate 300 and the active layer 320 to fill the void space during the process of forming the insulating layer 370. Alternatively, oxidation layers may be formed on the upper surface of the substrate 300 and a lower surface of the active layer 320 during the process of forming the insulating layer 370 with the oxidation layer.

Figure 11C:
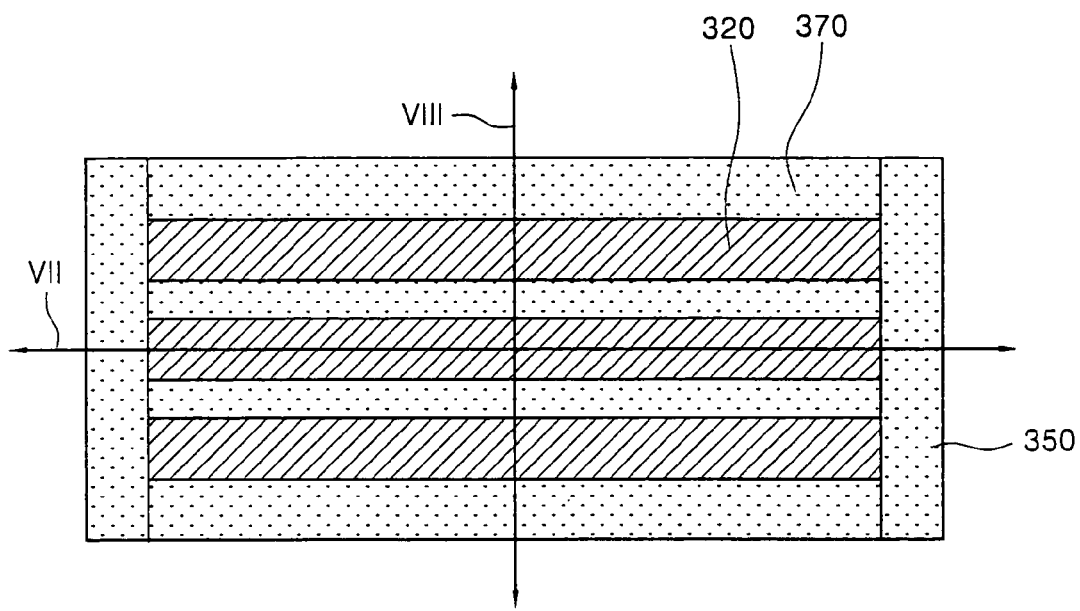
Figure 12D:
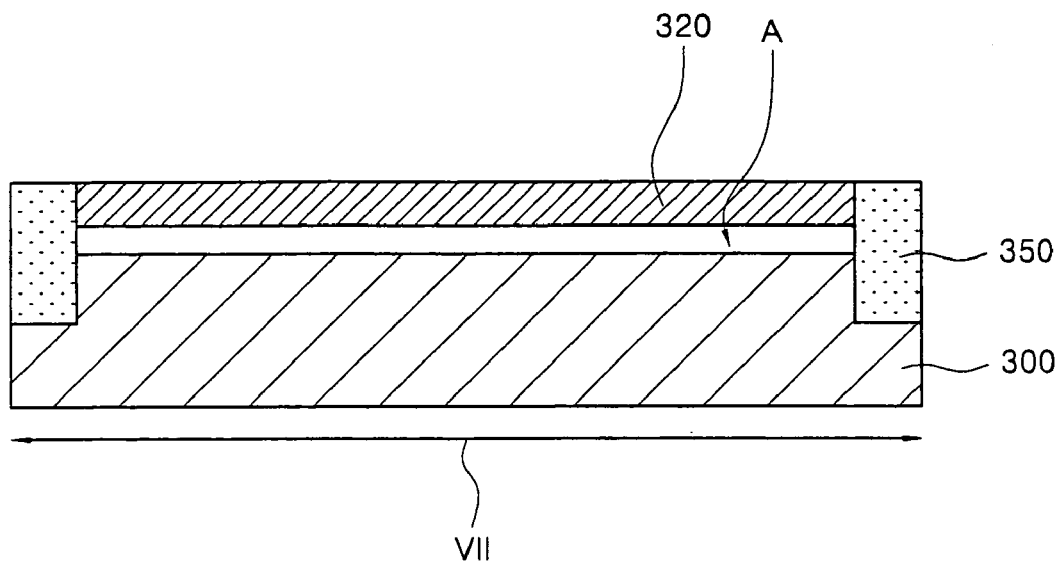
Figure 13D:
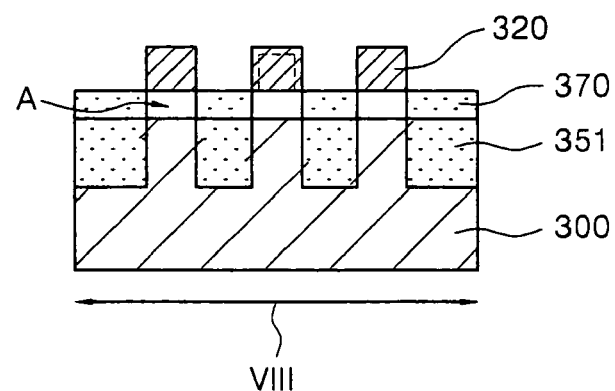

Referring to FIGS. 11C, 12D, and 13D, after removing the insulating layer 370 until a side of the active layer 320 is exposed, the mask 360 is removed. The silicon nitride layer 340 and the pad oxidation layer 330 are then removed to expose an upper surface of the active layer 320.

Moreover, a thermal oxidation process as shown in FIGS. 5A to 5C may be performed to form and remove a thermal oxidation layer (not shown) on the upper surface and side of the active layer 320, so that the thickness and the width of the active layer 320 may be reduced.

Figure 11D:
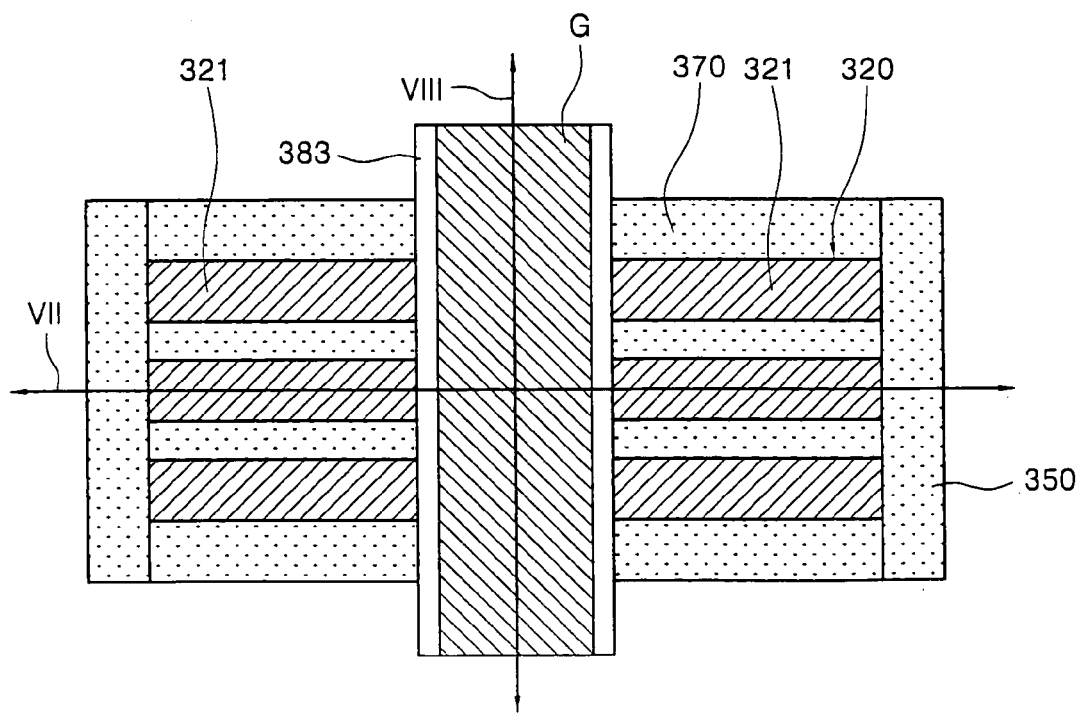
Figure 12E:
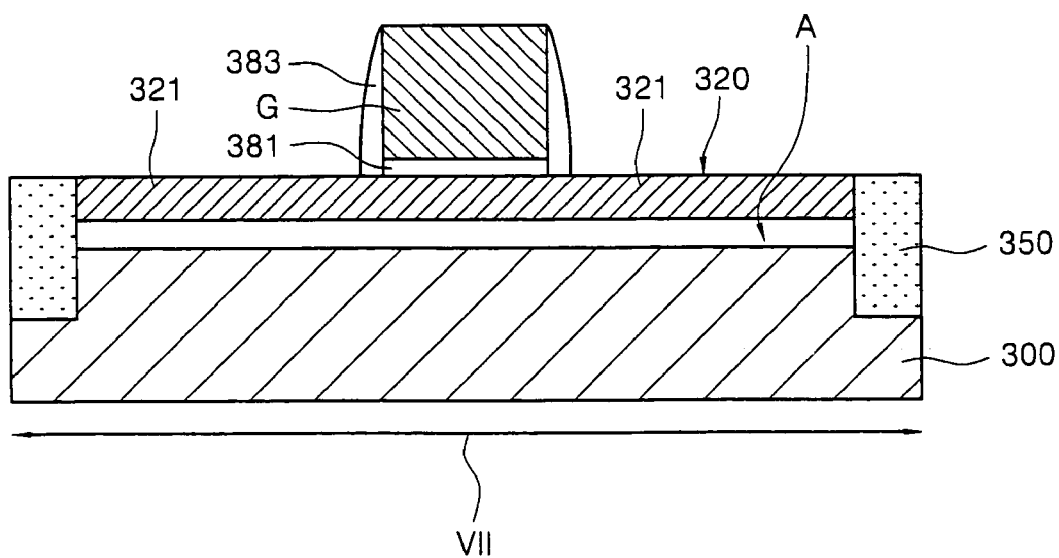
Figure 13E:
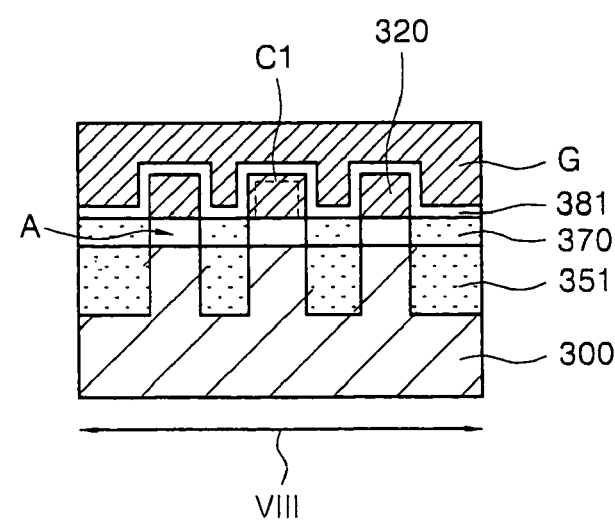

Referring to FIGS. 11D, 12E, and 13E, a gate oxidation layer 381 and a gate pattern G is formed to cover the upper surface and sides of the active layer 320. Thus, a gate having a structure of triple fin FET is formed where a channel C1 is formed on the upper surface and both sides of the active layer 320. An insulating layer spacer 383 is then formed on both sides of the gate pattern G. Source/drain 321 are then formed by implanting ions within the active layer 320 at both ends of the gate pattern G.

Alternatively, during the process of forming the triple fin FET type gate, some portions of the silicon nitride layer and the pad oxidation layer may remain on a lower portion of the gate to thereby form a dual fin FET type gate.

Figure 14A:
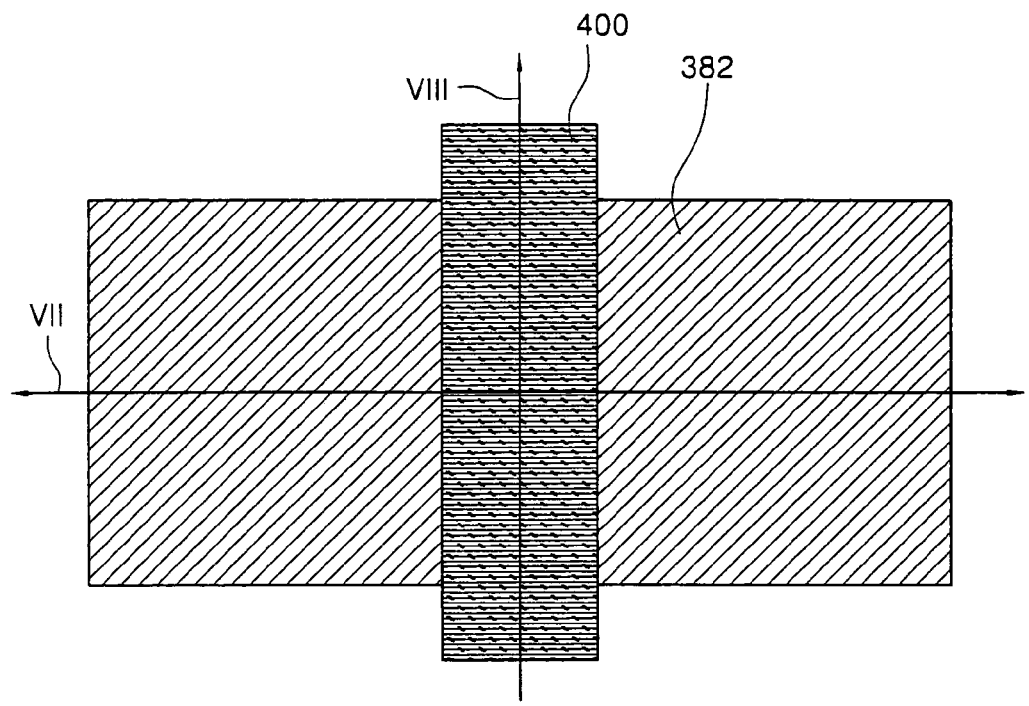
FIGS. 14A and 14B show plan views for explaining methods for fabricating semiconductor devices in accordance with other embodiments of the present invention.
Figure 14B:
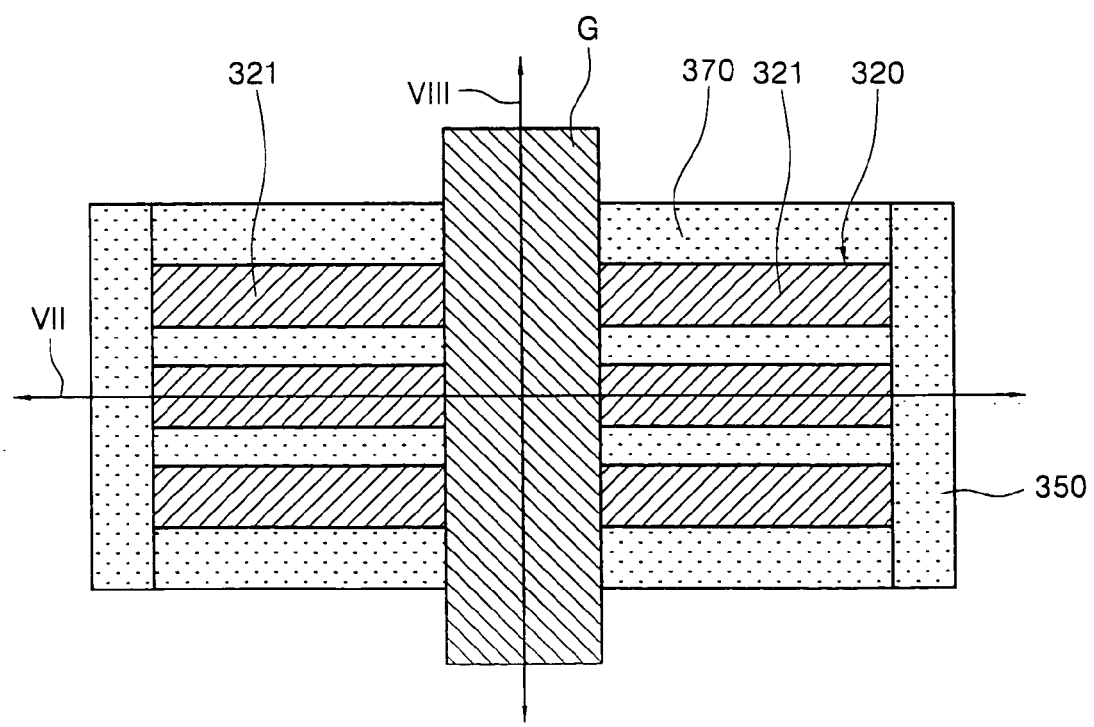
Figure 15A:
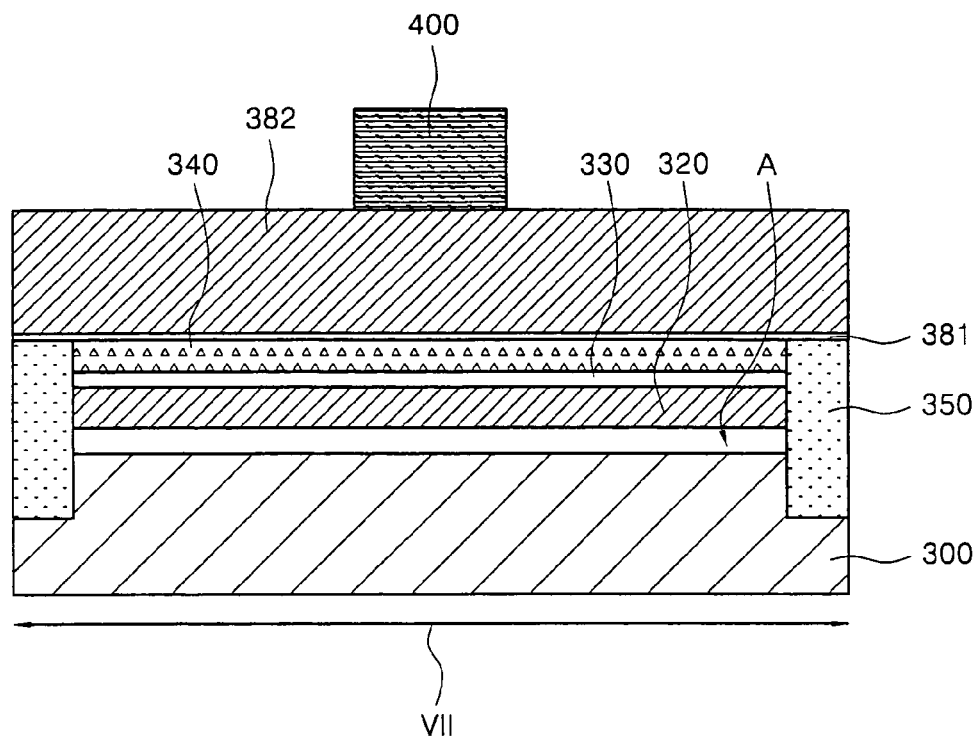
FIGS. 15A and 15B show vertical cross-sectional views taken along line VII of FIGS. 14A and 14B, respectively.
Figure 15B:
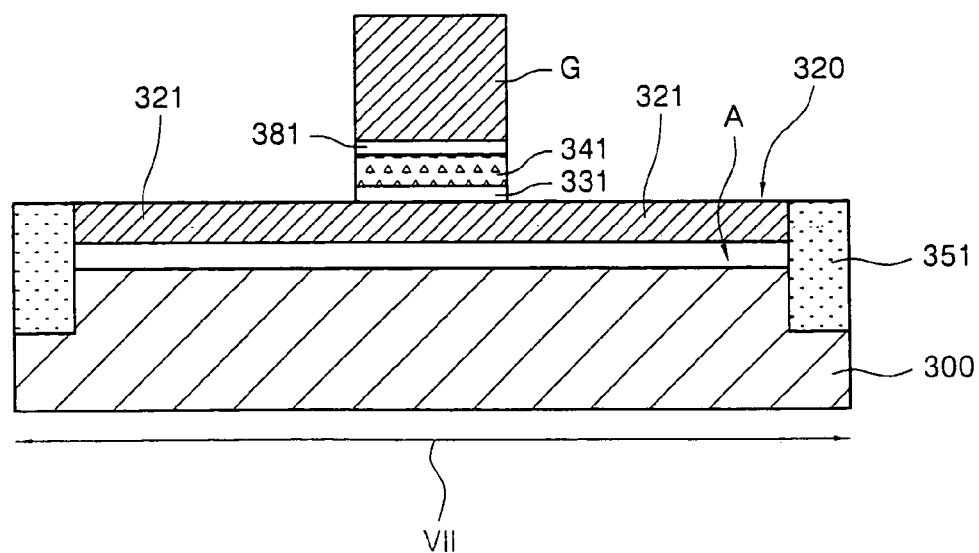

FIGS. 14A and 14B show plan views for explaining methods for fabricating semiconductor devices in accordance with other embodiments of the present invention. FIGS. 15A and 15B show vertical cross-sectional views taken along line VII of FIGS. 14A and 14B, respectively, and FIGS. 16A and 16B show vertical cross-sectional views taken along line VIII of FIGS. 14A and 14B, respectively.

First, as shown in FIGS. 12C and 13C, a sacrificial layer (not shown) between the substrate 300 and the active layer 320 is removed to form a void space A in accordance with the above-mentioned embodiments of the present invention. As this void space A is formed, a plurality of stack patterns S2 are formed to include the stacked active layer 320, and the pad oxidation layer 330 and the silicon nitride layer 340 on the active layer 320. The insulating layer 370 fills between the stack patterns S2. The insulating layer 350 is in contact with the void space A and ends of the stack patterns S2.

Figure 16A:
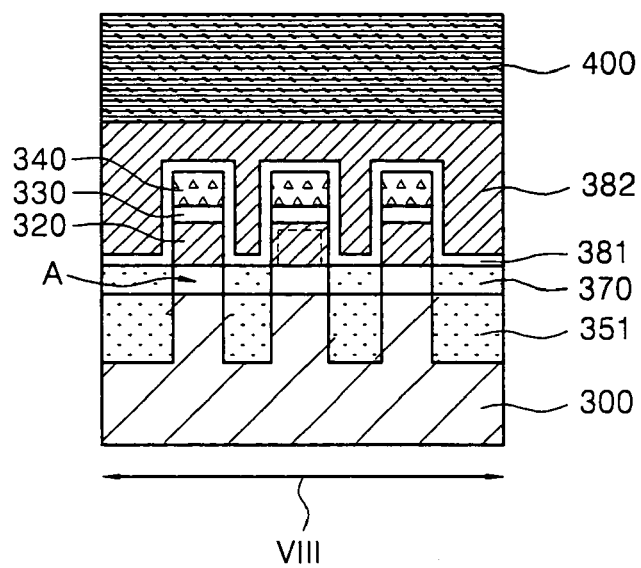
FIGS. 16A and 16B show vertical cross-sectional views taken along line VIII of FIGS. 14A and 14B, respectively.

Referring to FIGS. 14A, 15A, and 16A, the insulating layer 370 is removed until sides of the active layer 320 are exposed. A conductive layer 382 for a gate electrode and a gate oxidation layer 381 are formed on the silicon nitride 340, and a mask 400 is formed to define a gate pattern shape on the conductive layer 382.

Figure 16B:
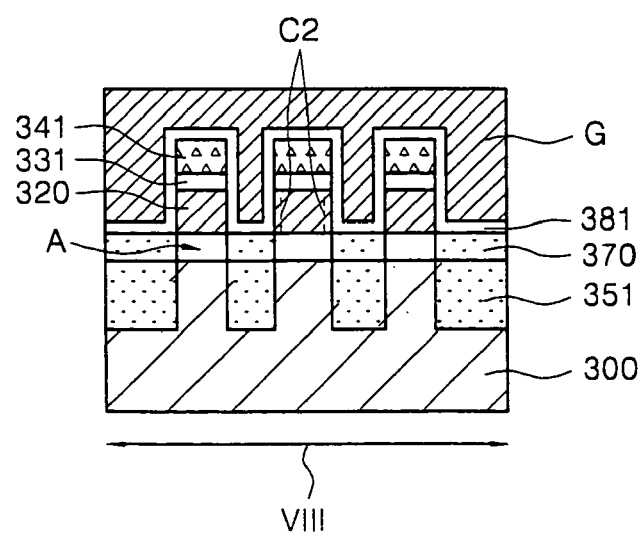

Referring to FIGS. 14B, 15B, and 16B, the conductive layer 382, the silicon nitride layer 340 and the pad oxidation layer 330 that are not covered with the mask 400, are etched to form a gate pattern G, a silicon nitride layer 341 and a pad oxidation layer pattern 331, and the mask 400 is removed. Thus, a transistor having a dual fin FET structure is formed where a channel C2 is formed on both sides of the active layer 320.

Hereinafter, structural characteristics of semiconductor devices in accordance with embodiments of the present invention will be described.

Referring to FIG. 9B, a semiconductor device in accordance with some embodiments of the present invention comprises a substrate 200 such as semiconductor substrate, an insulating layer 270 formed on the device isolation region of the substrate, and an active semiconductor layer 220 having a lattice constant close to that of the substrate 200 and being supported by the insulating layer 270 and spaced from the substrate 200 by a void space A therebetween. In addition, the semiconductor device may further comprise a gate pattern G stacked on the active semiconductor layer 220. The gate pattern G may be formed of a gate oxidation layer 281, a polysilicon layer 282, a silicide layer 283, and a mask insulating layer 284, which are sequentially stacked on the active layer 220. In addition, a semiconductor device in accordance with the present invention may further comprise a source/drain 286 formed on the active layer 220.

Referring to FIG. 10, the gate pattern G may be formed within the active semiconductor layer 220. In addition, the source/drain 286 may be formed within the active semiconductor layer 220 at both ends of the gate pattern G.

Referring to FIG. 13E, a gate oxidation layer 381 and a gate pattern G of the semiconductor device in accordance with embodiments of the present invention may cover the side and the upper surface of the active semiconductor layer 320.

Referring to FIG. 16B, the upper surface of the active semiconductor layer 320 is covered by the insulating layer, i.e., a pad oxidation layer pattern 331 and a silicon nitride layer pattern 341, and both sides of the active layer 320 may be in contact with a gate 380.

In accordance with some embodiments of the present invention, the sacrificial layer and the active semiconductor layer are epitaxially grown on a semiconductor substrate, and the sacrificial layer is selectively removed to thereby prepare an SOI substrate having the insulating layer between the semiconductor substrate and the active layer. In some embodiments, the active layer is epitaxially grown to facilitate control of its thickness. In addition, since the processes of bonding, isolating and polishing the active layer can be omitted, the active layer does not need to be thickly formed and may not be consumed, and a thick active semiconductor layer does not need to be formed on a wafer having a large diameter to thereby obtain the active layer having a uniform thickness. Therefore, it is possible not only to mass-produce the semiconductor device using the SOI substrate fabricated by embodiments of the present invention, but also to potentially decrease the manufacturing cost.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method for fabricating an SOI substrate, comprising:
   forming a stack pattern including a sacrificial layer and an active semiconductor layer in sequence on a substrate, the sacrificial layer being formed of a material having etch selectivity with respect to the substrate and the active semiconductor layer;
   forming a supporting pattern contacting at least two sides of the stack pattern on the substrate that exposes at least one side of the sacrificial layer and the active semiconductor layer on at least one side of the stack pattern; and
   selectively etching the sacrificial layer through at least one side thereof that is exposed, to form a void space between the substrate and the active semiconductor layer.

2. The method as claimed in claim 1, wherein forming the supporting pattern comprises:
   forming a supporting layer contacting all sides of the stack pattern on the exposed substrate; and
   patterning the supporting layer to expose at least one side of the sacrificial layer and the active semiconductor layer.

3. The method as claimed in claim 1:
   wherein forming a stack pattern is preceded by forming a supporting layer that surrounds a formation region of the stack pattern on the semiconductor substrate;
   wherein forming the stack pattern comprises forming the sacrificial layer and the active semiconductor layer on the exposed semiconductor substrate such that sides of the sacrificial layer and the active semiconductor layer come into contact with the supporting layer; and
   wherein forming the supporting pattern comprises patterning the supporting layer to expose at least one side of the sacrificial layer and the active semiconductor layer.

4. The method as claimed in claim 2, wherein forming the stack pattern comprises:
   sequentially epitaxially growing the sacrificial layer and the active semiconductor layer on the substrate; and
   patterning the sacrificial layer and the active semiconductor layer.

5. The method as claimed in claim 1, wherein selectively etching is followed by:
   forming a supporting layer that covers at least one exposed side of the active semiconductor layer and the void space.

6. The method as claimed in claim 1, wherein forming a supporting pattern comprises etching portions of the active layer and the sacrificial layer that are not in contact with the supporting pattern.

7. The method as claimed in claim 1, wherein selectively etching is followed by:
   forming an insulating layer between the substrate and the active semiconductor layer to at least partially fill the void space.

8. The method as claimed in claim 1, wherein selectively etching is followed by:
   forming a thermal oxidation layer on a surface of the substrate facing the active semiconductor layer and on a surface of the active semiconductor layer facing the substrate.

9. The method as claimed in claim 1, further comprising:
   reducing a thickness of the active layer.

10. The method as claimed in claim 1, wherein the substrate is a Si semiconductor substrate, and the sacrificial layer and the active semiconductor layer comprise a SiGe layer and a Si layer, respectively.

11. A method for fabricating an SOI substrate, comprising:
    forming a supporting pattern on a substrate that exposes a portion of the substrate;
    forming a sacrificial layer and an active semiconductor layer in sequence on the exposed portion of the substrate, such that at least two sides of the sacrificial layer and the active layer come into contact with the supporting pattern and at least one side of the sacrificial layer and the active semiconductor layer are exposed, the sacrificial layer being formed of a material having etch selectivity with respect to the substrate and the active semiconductor layer; and
    forming a void space between the substrate and the active semiconductor layer by selectively removing the sacrificial layer through at least one side thereof that is exposed.

12. The method as claimed in claim 11, wherein forming a void space is followed by:

forming a supporting layer that covers at least one exposed side of the active semiconductor layer and the void space.

13. The method as claimed in claim 11, wherein forming a void space is followed by:
forming an insulating layer between the substrate and the active semiconductor layer to at least partially fill the void space.

14. The method as claimed in claim 11, wherein forming a void space is followed by:
forming a thermal oxidation layer on a surface of the substrate facing the active semiconductor layer and on a surface of the active semiconductor layer facing the substrate.

15. The method as claimed in claim 11, further comprising:
reducing a thickness of the active layer.

16. The method as claimed in claim 11, wherein the substrate is a Si semiconductor substrate, and the sacrificial layer and the active semiconductor layer comprise a SiGe layer and a Si layer, respectively.

17. A method for fabricating a semiconductor device, comprising:
epitaxially growing a sacrificial layer and an active semiconductor layer on a substrate in sequence, with the sacrificial layer being formed of a material having etch selectivity with respect to the substrate and the active semiconductor layer;
patterning the active layer and the sacrificial layer to expose portions of the substrate in a device isolation region;
forming a first device isolation layer contacting at least two sides of the patterned active semiconductor layer and sacrificial layer on the exposed portions of the substrate;
exposing at least one side of the active semiconductor layer and the sacrificial layer;
forming a void space between the substrate and the active semiconductor layer by selectively removing the sacrificial layer through at least one side thereof that is exposed, with the first device isolation layer being used as a supporting layer of the active layer;
forming a second device isolation layer to cover the exposed side of the active semiconductor layer and the void space; and
forming a gate electrode on the active layer.

18. The method as claimed in claim 17, wherein the following is performed between forming a second device isolation layer and forming a gate electrode:
removing portions of the first and second device isolation layers to expose a side of the active semiconductor layer, and
wherein forming the gate electrode comprises forming a gate electrode that extends on an upper surface and the side of the active semiconductor layer.

19. The method as claimed in claim 18, further comprising oxidizing the side of the active layer after exposing the side of the active semiconductor layer.

20. The method as claimed in claim 17, wherein forming the gate electrode comprises:
selectively etching the active layer to form a trench; and
forming the gate electrode at least partially within the trench.

21. The method as claimed in claim 17, wherein forming the first device isolation layer comprises:

forming an insulating layer contacting all sides of the active layer and the sacrificial layer on the exposed substrate; and
patterning the insulating layer to expose at least two sides of the sacrificial layer and the active semiconductor layer.

22. The method as claimed in claim 17, wherein exposing at least one side of the active semiconductor layer and the sacrificial layer comprises removing at least a portion of the active semiconductor layer and the sacrificial layer that are not in contact with the first device isolation layer.

23. The method as claimed in claim 17, wherein forming a void space is followed by:
forming an insulating layer between the substrate and the active semiconductor layer to at least partially fill the void space.

24. The method as claimed in claim 17, wherein forming a void space is followed by:
forming a thermal oxidation layer on a surface of the substrate facing the active semiconductor layer and on a surface of the active semiconductor layer facing the substrate.

25. The method as claimed in claim 17, further comprising:
reducing a thickness of the active layer.

26. The method as claimed in claim 17, wherein the substrate is a Si semiconductor substrate, and the sacrificial layer and the active semiconductor layer comprise a SiGe layer and a Si layer, respectively.

27. A method for fabricating a semiconductor device, comprising:
forming an insulating layer on a device isolation region on a substrate that exposes a portion of the substrate;
forming a sacrificial layer and an active semiconductor layer in sequence on the exposed portion of the substrate, such that at least two sides of the sacrificial layer and active layer come into contact with the insulating layer, the sacrificial layer being formed of a material having etch selectivity with respect to the substrate and the active semiconductor layer;
patterning the insulating layer to form a first device isolation layer that covers at least two sides of the sacrificial layer and the active semiconductor layer and that exposes at least one side of the sacrificial layer and the active semiconductor layer;
forming a void space between the substrate and the active semiconductor layer by selectively removing the sacrificial layer through the at least one side thereof that is exposed, with the first device isolation layer being used as a supporting layer of the active layer;
forming a second device isolation layer to cover the at least one exposed side of the active semiconductor layer and the void space; and
forming a gate electrode on the active layer.

28. The method as claimed in claim 27, wherein the following is performed between forming a second device isolation layer and forming a gate electrode:
removing portions of the first and second device isolation layers to expose a side of the active layer, and
wherein forming the gate electrode comprises forming a gate electrode that extends on an upper surface and the side of the active semiconductor layer.

29. The method as claimed in claim 28, further comprising oxidizing the side of the active layer after exposing the side of the active semiconductor layer.

30. The method as claimed in claim 27, wherein forming a void space is followed by:

forming an insulating layer between the substrate and the active semiconductor layer to at least partially fill the void space.

31. The method as claimed in claim 27, further comprising:
reducing a thickness of the active layer.

32. The method as claimed in claim 27, wherein the substrate is a Si semiconductor substrate, and the sacrificial layer and the active semiconductor layer comprise a SiGe layer and a Si layer, respectively.

33. A method for fabricating a semiconductor device, comprising:
forming a first device isolation layer that covers portions of a device isolation region on a substrate and that exposes a portion of the substrate;
forming a sacrificial layer and an active semiconductor layer in sequence on the exposed portion of the substrate, such that at least two sides of the sacrificial layer and the active semiconductor layer come into contact with the first device isolation layer, the sacrificial layer being formed of a material having etch selectivity with respect to the semiconductor substrate and the active layer;
selectively etching the active layer and the sacrificial layer that are not in contact with the first device isolation layer to expose at least one other side of the sacrificial layer and the active layer;
forming a void space between the semiconductor substrate and the active layer by selectively removing the sacrificial layer through the at least one other side of the sacrificial layer, with the first device isolation layer being used as a supporting layer of the active layer;
forming a second device isolation layer that covers the exposed sides of the active semiconductor layer and the void space; and
forming a gate electrode on the active layer.

34. The method as claimed in claim 33, wherein the following is performed between forming a second device isolation layer and forming a gate electrode:
removing portions of the first and second device isolation layers to expose a side of the active layer, and
wherein forming the gate electrode comprises forming a gate electrode that extends on an upper surface and the side of the active semiconductor layer.

35. The method as claimed in claim 34, further comprising oxidizing the side of the active layer after exposing the side of the active semiconductor layer.

36. The method as claimed in claim 34, wherein forming a void space is followed by:
forming an insulating layer between the substrate and the active semiconductor layer to at least partially fill the void space.

37. The method as claimed in claim 33, further comprising:
reducing a thickness of the active layer.

38. The method as claimed in claim 33, wherein the substrate is a Si semiconductor substrate, and the sacrificial layer and the active semiconductor layer comprise a SiGe layer and a Si layer, respectively.

39. A method for fabricating an SOI substrate comprising:
providing a substrate having a sacrificial layer thereon, an active semiconductor layer on the sacrificial layer remote from the substrate and a supporting layer that extends along at least two sides of the active semiconductor layer and the sacrificial layer and onto the substrate, and that exposes at least one side of the sacrificial layer; and
etching at least some of the sacrificial layer through the at least one side thereof that is exposed by the supporting layer to form a void space between the substrate and the active semiconductor layer, such that the active semiconductor layer is supported in spaced-apart relation from the substrate by the supporting layer.

40. A method according to claim 39 wherein etching is followed by at least partially filling the void space with an insulating layer.

41. A method according to claim 39 wherein the substrate is a semiconductor substrate, wherein the sacrificial layer is an epitaxial sacrificial layer and wherein the active semiconductor layer is an epitaxial active semiconductor layer.

* * * * *